(12) United States Patent
Torigoe et al.

(10) Patent No.: US 9,298,098 B2
(45) Date of Patent: Mar. 29, 2016

(54) EXPOSURE APPARATUS AND METHOD OF CONFIGURING EXPOSURE APPARATUS

(75) Inventors: Tsunemitsu Torigoe, Hwaseong-si (KR); Chang Hoon Kim, Asan-si (KR); Kab Jong Seo, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 738 days.

(21) Appl. No.: 13/615,299

(22) Filed: Sep. 13, 2012

(65) Prior Publication Data

US 2013/0215405 A1   Aug. 22, 2013

(30) Foreign Application Priority Data

Feb. 21, 2012   (KR) .................. 10-2012-0017331

(51) Int. Cl.
G03B 27/42 (2006.01)
G03F 7/20 (2006.01)

(52) U.S. Cl.
CPC ........ *G03F 7/70141* (2013.01); *G03F 7/70075* (2013.01)

(58) Field of Classification Search
CPC . G03F 7/70075; G03F 7/70141; G03F 7/702; G03F 7/70191; G03F 7/70091; G03F 7/70308; G03F 7/7095; G02B 19/0047; G02B 19/0095; G02B 26/02; H01S 3/08; H01S 3/08068; H01S 3/2325; H01S 3/2333; H01S 3/081; H01S 3/2366
See application file for complete search history.

(56) References Cited

U.S. PATENT DOCUMENTS

| 5,392,310 | A | * | 2/1995 | Klein | 372/95 |
| 5,662,410 | A | | 9/1997 | Suganuma | |
| 2001/0015795 | A1 | * | 8/2001 | Nishi | 355/53 |
| 2010/0078577 | A1 | * | 4/2010 | Moriya et al. | 250/504 R |
| 2010/0108913 | A1 | * | 5/2010 | Ershov et al. | 250/492.1 |

FOREIGN PATENT DOCUMENTS

| JP | 06-011609 | 1/1994 |
| JP | 07-134203 | 5/1995 |
| JP | 2002-162750 | 6/2002 |
| JP | 2002-198301 | 7/2002 |
| JP | 2003-107394 | 4/2003 |
| JP | 2004-258090 | 9/2004 |
| KR | 1020030006829 A | 1/2003 |
| KR | 100800579 | 1/2008 |

* cited by examiner

*Primary Examiner* — Mesfin T Asfaw
(74) *Attorney, Agent, or Firm* — Innovation Counsel LLP

(57) ABSTRACT

A light exposer according to an embodiment of the present invention includes an exposure beam generator generating an exposure beam, and a vacuum chamber passing the exposure beam generated by the exposure beam generator and including a first fly eye lens having a plurality of convex lens like fly eyes. The exposure beam generator includes an oscillator including an oscillator pumping chamber, a first prism and a second prism, and a first exposure beam diameter changing lens positioned before the first prism and enlarging a diameter of the exposure beam.

18 Claims, 29 Drawing Sheets

<Interface-2 Electric field intensity near an arbitrary angle>
Intensity ratio

| interface-2 | | |
|---|---|---|
| silica ※2 | air | ratio |
| 0.458 | 1.695 | 3.701 |

FIG.21

| lens interval | Beam diameter | spread angle |
|---|---|---|
| 7 | 5.9 | 1.443 |
| 6 | 6.34 | 1.304 |
| 5 | 6.79 | 1.166 |
| 4 | 7.24 | 1.029 |
| 3 | 7.68 | 0.892 |
| 2 | 8.12 | 0.755 |
| 1 | 8.56 | 0.62 |
| 0 | 9 | 0.485 |
| -1 | 9.442 | 0.351 |
| -2 | 9.878 | 0.217 |
| -3 | 10.31 | 0.084 |
| -4 | 10.75 | -0.048 |
| -5 | 11.18 | -0.179 |
| -6 | 11.61 | -0.31 |
| -7 | 12.03 | -0.44 |

- means that light is converging

EXPOSURE APPARATUS AND METHOD OF CONFIGURING EXPOSURE APPARATUS

CROSS-REFERENCE TO RELATED APPLICATION

This application claims priority to and the benefit of Korean Patent Application No. 10-2012-0017331 filed in the Korean Intellectual Property Office on Feb. 21, 2012, the entire contents of which are incorporated herein by reference.

BACKGROUND (a) Field

The present invention relates to a light exposer and a controlling method of a light exposer.

(b) Description of the Related Art

In manufacturing display devices, the size of a mother substrate may be increased to accommodate more display device parts on the mother substrate, thereby reducing the unit cost for each display device. Nevertheless, if the size of a mask corresponding to the mother substrate also is increased, the manufacturing cost of the mask may be substantially increased; as a result, the total cost may be increased.

For avoiding the increased manufacturing cost that may be caused by the increased size of the mask, the use of a mask may be minimized. For example, an inkjet printing method and/or a reverse offset printing method that does not require a mask may be applied.

Nevertheless, printing methods may be applicable to only a portion of the display device manufacturing process, and some steps in the manufacturing process may still require one or more masks. For example, the wiring manufacturing steps generally require one or more photolithography process steps using one or more masks.

In general, to form a pattern, such as a pixel pattern or a wiring pattern, a photolithography process is executed. In the photolithography process, a mask is used in an exposure process that involves irradiating an exposure beam through an opening of the mask.

An exposure beam used in the exposure process may be from a light source (such as a laser source), and a light exposer may continuously emit the exposure beam for a long period of time. Typically, the illumination of the exposure beam provided by the light exposer may be deteriorate due to the long-time usage of the light exposer. For example, when the light exposer has been used more than 30 days, damage may be generated in an optic system of the exposure beam generator, and causing the illumination of the exposure beam to deteriorate. As a result, the illumination uniformity of the exposure process may substantially deteriorate, and the exposure capacity of may substantially deteriorate.

The above information disclosed in this Background section is only for enhancement of understanding of the background of the invention. The Background may contain information that does not form the prior art that is already known in this country to a person of ordinary skill in the art.

SUMMARY

An embodiment of the present invention is related to a light exposer and a light exposure device configuration method having advantages of preventing or minimizing damage to an exposure beam generator when the exposure beam generator is used for a long period of time.

A light exposer according to an embodiment of the present invention includes an exposure beam generator generating an exposure beam, and a vacuum chamber passing the exposure beam generated by the exposure beam generator and including a first fly eye lens having a plurality of convex lens like fly eyes. The exposure beam generator includes an oscillator including an oscillator pumping chamber, a first prism and a second prism, and a first exposure beam diameter changing lens positioned before the first prism and enlarging a diameter of the exposure beam.

The first exposure beam diameter changing lens may have a concave cylindrical lens structure.

The exposure beam generator may further include a third exposure beam diameter changing lens positioned after the second prism and reducing the diameter of the exposure beam, and the third exposure beam diameter changing lens may have a convex cylindrical lens structure.

A direction that the second exposure beam diameter changing lens reduces the diameter of the exposure beam may be the same as a direction that the first exposure beam diameter changing lens enlarges the diameter of the exposure beam.

The diameter of the exposure beam according to a lens interval of the first exposure beam diameter changing lens and the second exposure beam diameter changing lens may satisfy an equation below.

$$y=-0.4386x+8.9887$$

Here, x is a lens interval and y is a diameter of the exposure beam.

The diameter of the exposure beam may have a minimum value when an illumination distribution of the exposure beam is most stable, and a maximum value that is less than the width of the first fly eye lens by 1 mm.

The diameter of the exposure beam may be more than 8 mm to less than 11 mm.

The distance between the first exposure beam diameter changing lens and the first prism may be 44.9 mm, and the distance between the third exposure beam diameter changing lens and the second prism may be 36.2 mm.

The exposure beam generator may further include a second exposure beam diameter changing lens positioned after the first exposure beam diameter changing lens and maintaining the diameter of the exposure beam to be constantly progressed, and the second exposure beam diameter changing lens has the convex cylindrical lens structure.

The distance between the second exposure beam diameter changing lens and the first prism may be 34.2 mm.

The exposure beam generator may further include a fourth exposure beam diameter changing lens positioned after the third exposure beam diameter changing lens and maintaining the diameter of the exposure beam to be constantly progressed, and the fourth exposure beam diameter changing lens has the concave cylindrical lens structure.

The distance between the fourth exposure beam diameter changing lens and the second prism may be 120.4 mm.

The exposure beam generator may further include an exposure beam diffusion unit expanding the exposure beam generated in the oscillator, an amplifier including an amp pumping chamber, a high-frequency generator including a second-harmonic generator and a third-harmonic generator, and first and second bend mirrors bending a light path of the exposure beam.

In one or more embodiments of the invention, a method for configuring a light exposer may include a prism, an exposure beam generator including first and second exposure beam diameter changing lens, and a vacuum chamber passing the exposure beam generated from the exposure beam generator and including a first fly eye lens having a plurality of convex lens like fly eyes according to an embodiment of the present invention includes: generating an exposure beam from the exposure beam generator; measuring a shape of the exposure beam in the vacuum chamber; and adjusting the first or second exposure beam diameter changing lens when the measured shape of the exposure beam is deviated from a predetermined range.

The adjusting of the first or second exposure beam diameter changing lens may include changing a distance of the first or second exposure beam diameter changing lens to the prism.

The diameter of the exposure beam according to a lens interval of the first exposure beam diameter changing lens and the second exposure beam diameter changing lens may satisfy an equation below.

$$y = -0.4386x + 8.9887$$

Here, x is a lens interval and y is a diameter of the exposure beam.

The diameter of the exposure beam may have a minimum value when an illumination distribution of the exposure beam is most stable, and a maximum value that is less than the width of the first fly eye lens by 1 mm.

The diameter of the exposure beam may be more than 8 mm to less than 11 mm.

As described above, the lens for changing (e.g., enlarging) the diameter of the beam is added to the exposure beam generator to reduce the energy density of the beam such that damage to the exposure beam generator may be prevented or minimized even if the exposure beam generator has been used for a long period of time. As a result, the illumination of the exposure beam and associated uniformity may be substantially constant, to ensure consistency in the exposure process of photolithography. Advantageously, productivity and quality of display device manufacturing may be optimized.

BRIEF DESCRIPTION OF THE DRAWINGS

FIG. 21, FIG. 22, FIG. 23, FIG. 24, FIG. 25, FIG. 26, and FIG. 27 illustrate one or more characteristics of an exposure beam generator according to one or more embodiments of the present invention.

DETAILED DESCRIPTION OF THE EMBODIMENTS

Figure 1:
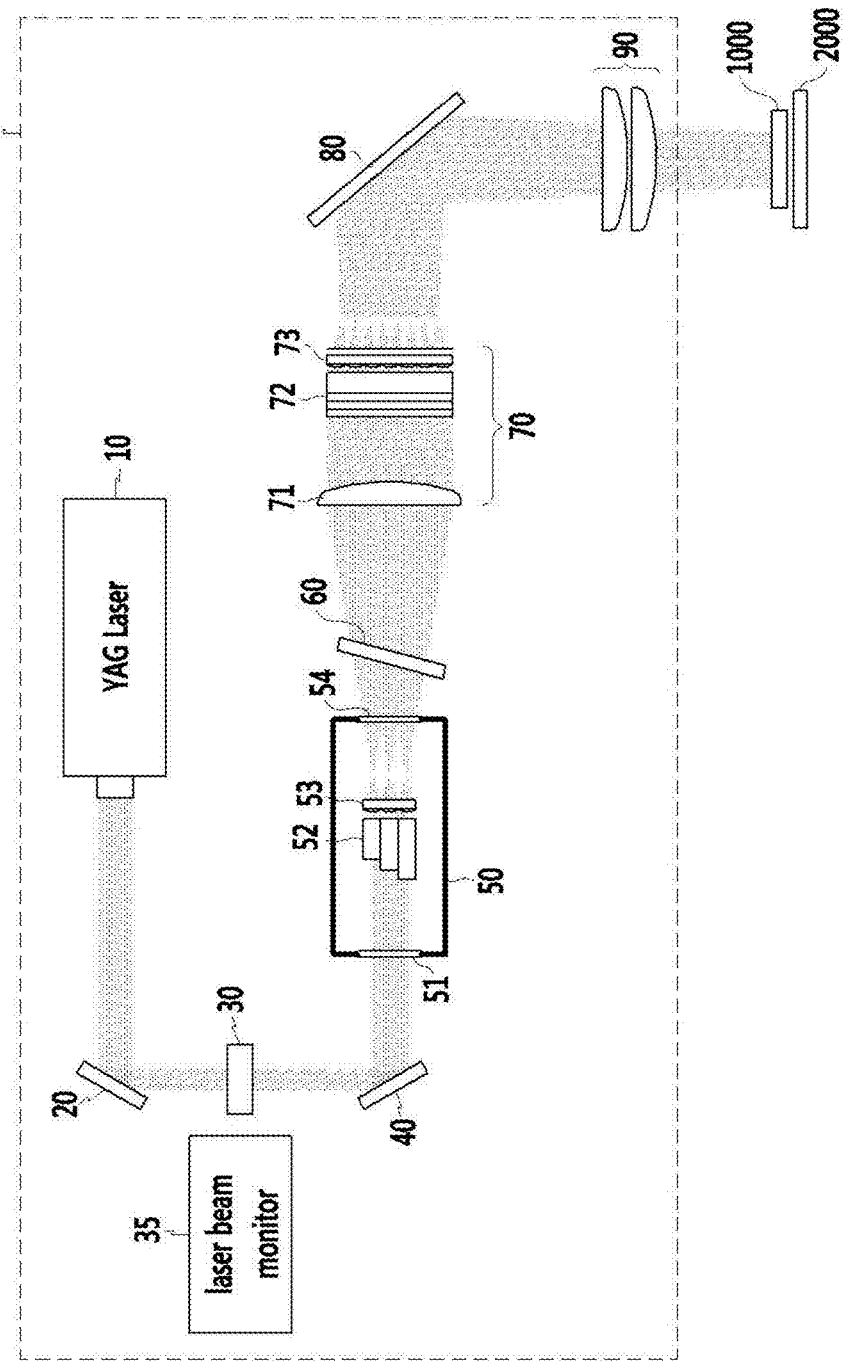
FIG. 1 is a schematic representation illustrating a side view of a light exposer and an exposure path according to an embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a light exposer and an exposure path according to an embodiment of the present invention will be described with reference to FIG. 1.

FIG. 1 is a schematic representation illustrating a side view of a light exposer and an exposure path according to an embodiment of the present invention.

A light exposer 1 according to an embodiment of the present invention includes an exposure beam generator 10 (which may include a YAG laser in one or more embodiments), first, second, and third mirrors 20, 40, and 80, a vacuum chamber 50 including a first light path difference plate 52 and a first fly eye lens 53, a plane parallel rotation plate 60, first and second light collecting lenses 71 and 90, a second light path difference plate 72, and a second fly eye lens 73. In one or more embodiments, exposure beam monitor units 30 and 35 are further included to monitor the path of the exposure beam.

Figure 29:
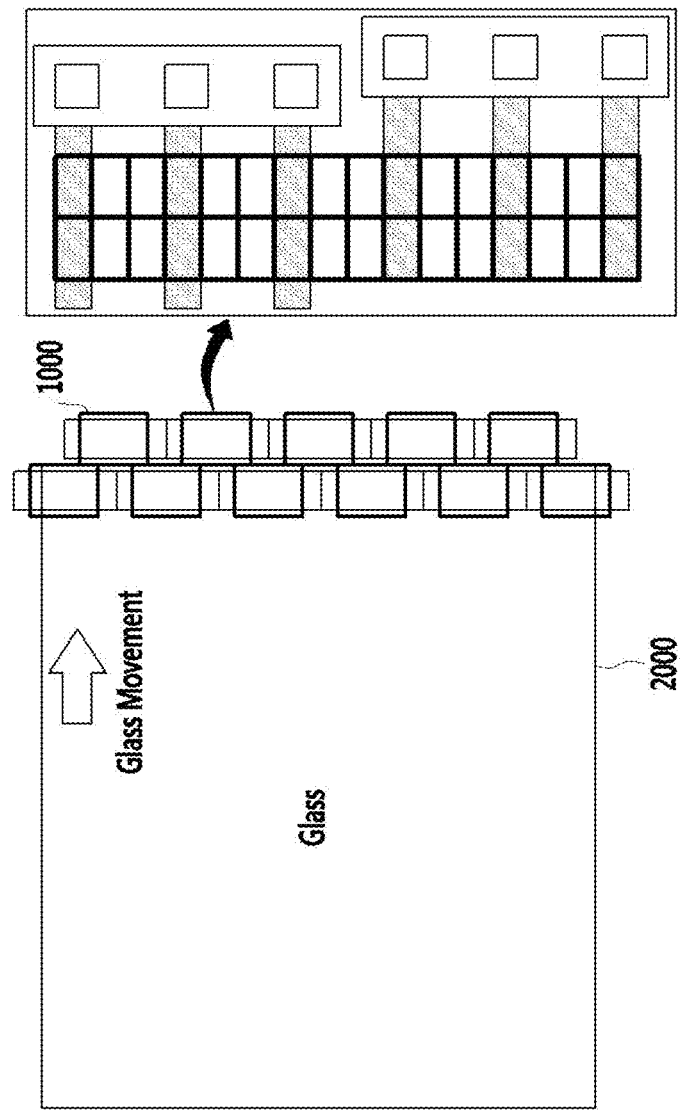
FIG. 29 illustrates an exposure process of a scan method according to an embodiment of the present invention.

The exposure beam emitted from the light exposer 1 is provided to a substrate 2000 through a mask 1000, wherein the mask 1000 and the substrate 2000 may maintain a predetermined interval (in a range of about 200-350 nm). In one or more embodiments, as illustrated in FIG. 29, the mask 1000 may include a plurality of small masks partially covering a substrate (e.g., a glass substrate).

Operation and features of the exposure beam emitted from the light exposer 1 according to the present embodiment are described as follows.

The exposure beam generator 10 is a light source that generates the exposure beam. The exposure beam generator 10 may be a YAG laser in one or more embodiments. One or more of exposure beams having various wavelengths may be used according to one or more embodiments.

A light path of the exposure beam emitted from the exposure beam generator 10 is respectively deflected by 90 degrees while reflected by the first mirror 20 and the second mirror 40, such that the light then enters the vacuum chamber 50. The vacuum chamber 50 includes a first chamber window 51 for receiving the exposure beam and a second chamber window 54 for discharging the exposure beam. The first light path difference plate 52 and the first fly eye lens 53 may be positioned inside the vacuum chamber 50 and positioned between the first chamber window 51 and the second chamber window 54. The first light path difference plate 52 provides a light path difference (or optical path difference) to the exposure beam. The first fly eye lens 53 may include a plurality of convex lenses arranged like an eye of a fly. The light passing through the first light path difference plate 52 is collected to a focal point and diffused according to each convex lens. The focal points of the first fly eye lens 53 may be positioned inside the vacuum chamber 50.

The exposure beam emitted through the second chamber window 54 of the vacuum chamber 50 is reflected by the third mirror 80 after passing through the plane parallel rotation plate 60 and an optical unit 70, and is provided to the mask 1000 after being transmitted through the second light collecting lens 90. In one or more embodiments, the optical unit 70 includes the first light collecting lens 71, the second light path difference plate 72, and the second fly eye lens 73.

The plane parallel rotation plate 60 is oblique with respect to the second chamber window 54 and is oblique with respect to the light path. The first light collecting lens 71 functions to collect the light that is diffused through the first fly eye lens 53 and transmitted through the plane parallel rotation plate 60. The second light path difference plate 72 may provide a light path difference to the light transmitted from the first light collecting lens 71. The first fly eye lens 53 may collect the light provided by the second light path difference plate 72 to the focal points of the second fly eye lens 73 and diffusing the light. The second light path difference plate 72 and the second fly eye lens 73 may have features and advantages that are analogous to those of the first light path difference plate 52 and the first fly eye lens 53. Subsequently, the light path of the light provided by the second fly eye lens 73 is deflected by 90 degrees by the third mirror 80. As a result, the light that is diffused by the second fly eye lens 73 passes through the second light collecting lens 90 and is transmitted to the mask. In one or more embodiments, the second light collecting lens 90 includes two convex lenses. In one or more embodiments, the second light collecting lens 90 may include a convex lens and/or an additional light collecting lens. In one or more embodiments, the first light path difference plate 52 and the second light path difference plate 72 may have different structures or may have the same structure; the light path differences provided by the first and second light path difference plates 52 and 72 may have the same value or different values.

In one or more embodiments, at least one of the exposure beam monitor units 30 and 35 may be disposed between the first mirror 20 and the second mirror 40 to monitor whether the path of the exposure beam deviates from a predetermined course. The exposure beam monitor unit 30 according to an embodiment of the present invention includes equipment for capturing one or more images of the inside and/or outside of the exposure beam that may indicate the path of the exposure beam. The one or more images and/or associated information may be transmitted to a light exposer controller (not shown) for determining the path of the exposure beam. According to one or more embodiments, one or more of the exposure beam monitor units 30 and 35 change a portion of the path of the exposure beam for facilitating observation of the path. In one or more embodiments, a path of the exposure beam may be differently from the path shown in FIG. 1. The exposure beam generator 10 according to one or more embodiments of the present invention will be described in detail with reference to figures from FIG. 2 to FIG. 11.

Figure 2:
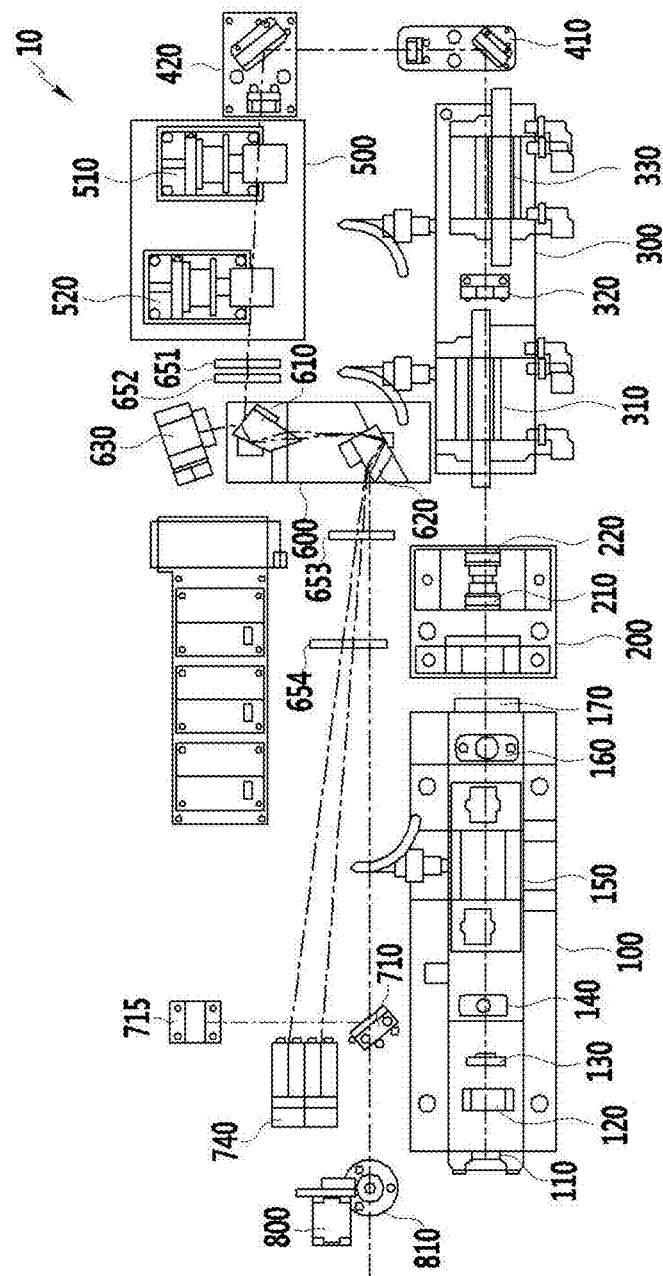
FIG. 2 is a detailed view illustrating an exposure beam generator according to an embodiment of the present invention.
Figure 9:
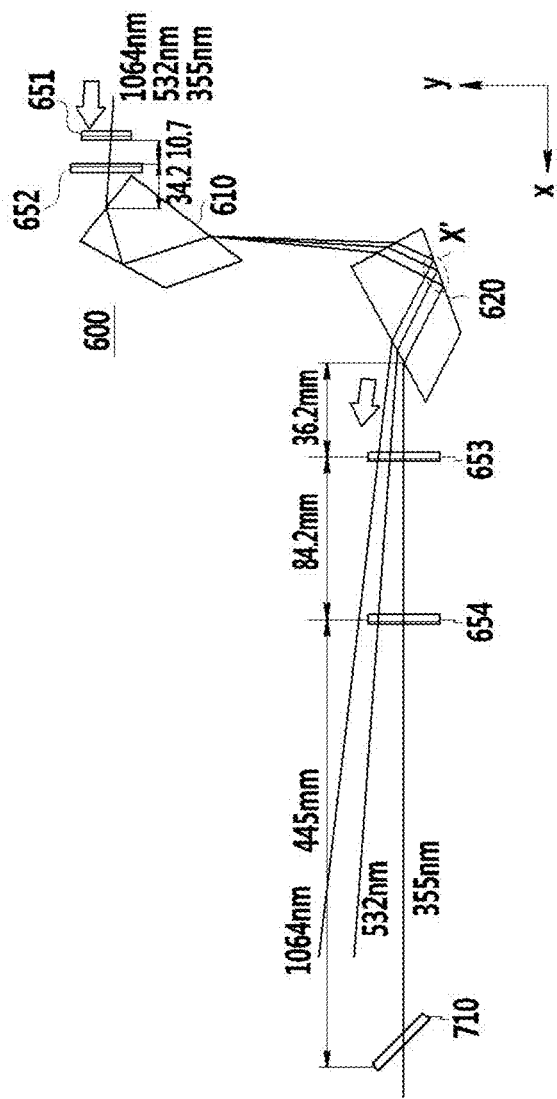
Figure 10:
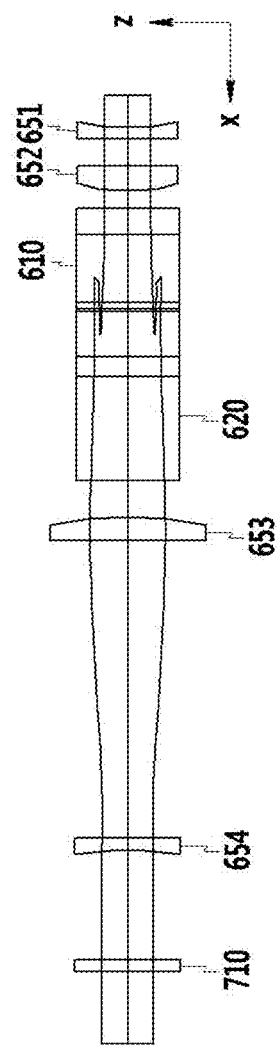
Figure 11:
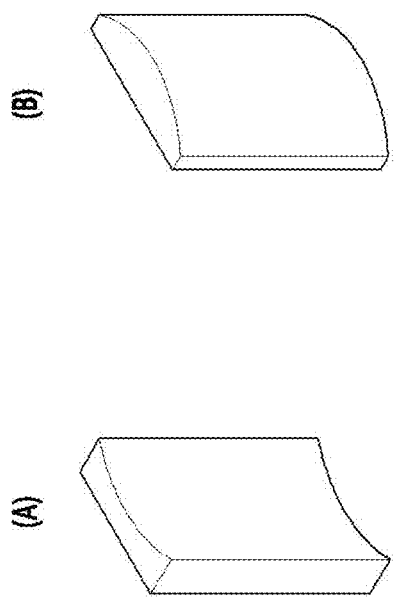

FIG. 2 is a detail view illustrating an exposure beam generator according to an embodiment of the present invention. Figures from FIG. 3 to FIG. 8 are schematic representations illustrating portions of an exposure beam generator according to an embodiment of the present invention and/or illustrating operation characteristics of the exposure beam generator. FIG. 9 and FIG. 10 illustrate features associated with a wavelength dividing unit of an exposure beam generator according to an embodiment of the present invention. FIG. 11 shows perspective views illustrating an exposure beam diameter changing lens according to one or more embodiments of the present invention.

An overall structure of the exposure beam generator 10 will be described with reference to FIG. 2.

The exposure beam generator 10 includes an oscillator 100, an exposure beam diffusion unit 200, an amplifier 300, a high-frequency generator 500, a wavelength dividing unit 600, exposure beam diameter changing lenses 651, 652, 653, and 654, first and second bend mirrors 410 and 420, a sampling mirror 710, a power monitor 715, and an output shutter unit 800.

Figure 3:
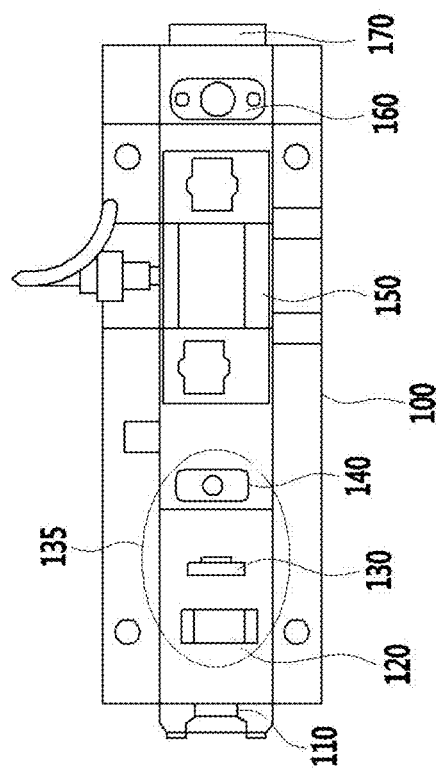
FIG. 3, FIG. 4, FIG. 5, FIG. 6, FIG. 7, FIG. 8, FIG. 9, FIG. 10, and FIG. 11 are schematic representations illustrating portions of an exposure beam generator according to one or more embodiments of the present invention and/or illustrating operation characteristics of the exposure beam generator according to one or more embodiments of the present invention.

Referring to FIG. 3, the oscillator 100 that initiates the exposure beam includes a rear mirror 110, a pocket cell 120, a wave plate 130, first and second polarizers 140 and 160, an oscillator pumping chamber 150, and a front mirror 170. The pocket cell 120, the wave plate 130, and the first polarizer 140 together form a Q switch 135.

The components of the oscillator 100 may include the following features: The rear mirror 110 totally reflects the light incident on the rear mirror 110. The pocket cell 120, which performs a switch function, enables the exposure beam (a laser beam) to be emitted when the pocket cell 120 is in an on state for changing the exposure beam from cyclic polarization to linear polarization. The wave plate 130 has a $\lambda/4$ phase difference. The first and second polarizers 140 and 160 only transmit light that is linearly polarized in a predetermined direction. The oscillator pumping chamber 150 houses a flash lamp such as a YAG rod material. In a flash lamp, a laser medium is excited such that a population inversion state (in which energy is accumulated) is formed, and a portion of the laser medium of the population inversion state is smooth such that the light is emitted by natural emission. The front mirror 170 may partially transmit and/or partially reflect the oscillated exposure beam to enable resonance.

Figure 4:
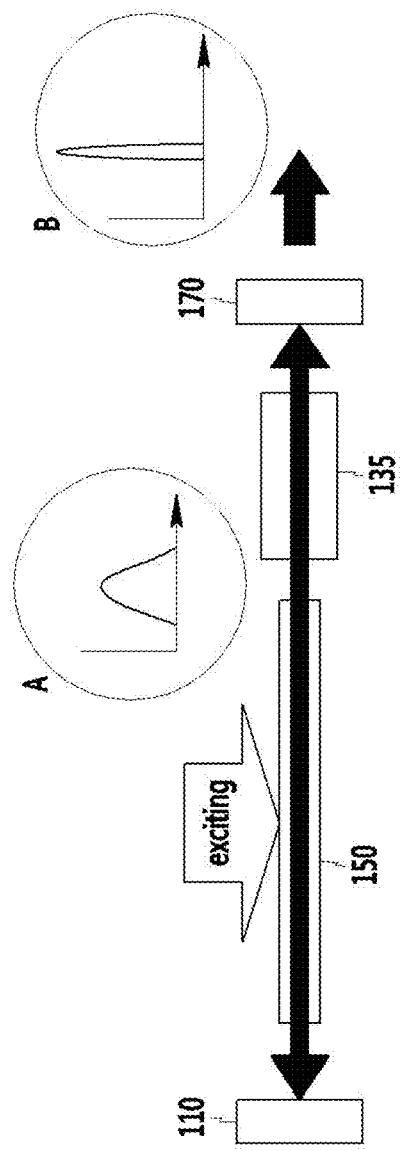
Figure 5:
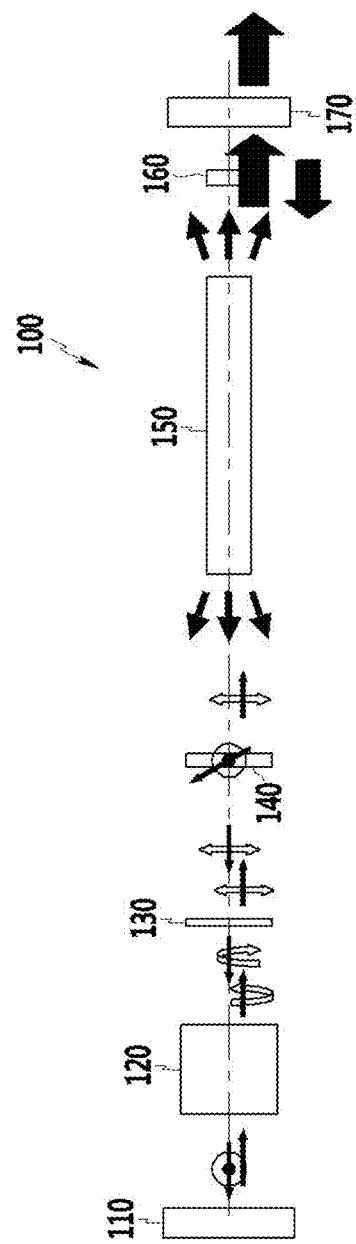

A method of generating the exposure beam in the oscillator 100 is schematically shown in FIG. 4. FIG. 5 shows a polarization direction in the oscillator 100 according to an embodiment of the present invention.

Referring to FIG. 4, in the oscillator 100, the oscillator pumping chamber 150 is positioned between the rear mirror 110 (which performs total reflection) and the front mirror 170 (which transmits a portion of the light and reflects the rest of the light) such that a pulse having a period of several hundred microseconds (μsec) is formed. A flash lamp such as an Nd:YAG rod is housed in the oscillator pumping chamber 150 according to one or more embodiments.

The Q switch 135 is disposed between the oscillator pumping chamber 150 and the front mirror 170 such that the width of the excited pulse is reduced for changing the oscillating pulse into a pulse having a high energy peak. For example, a pulse having a relatively wide width as shown in the A graph of FIG. 4 is changed into a pulse having a relatively narrow width and high energy as shown in the B graph by using the Q switch 135. The high energy pulse is emitted through the front mirror 170.

The operation and the polarization direction in the oscillator 100 according to the one or more embodiments will be described with reference to FIG. 5 based on the operation of the basic oscillator 100.

The excited light is emitted to the surrounding area by the oscillator pumping chamber 150. In an embodiment of the present invention, when using an Nd:YAG rod, light of a 1064 nm wavelength is naturally excited and emitted. The light emitted to the surrounding area is directly incident into the first polarizer 140 and/or into the second polarizer 160. The light incident to the second polarizer 160 is polarized and is partially emitted after being incident to the front mirror 170; however, most of the light is reflected by the front mirror 170, is re-incident to the second polarizer 160, and is then incident to the first polarizer 140. The light incident into the first polarizer 140 is linear-polarized according to the polarization direction of the first polarizer 140. In one or more embodiments, as illustrated in FIG. 5, light having the linear polarization of the vertical direction (↕) is transmitted, and light having linear polarization of a direction perpendicular to the vertical direction (↕) is blocked. Hereafter, light having the linear polarization of the vertical direction (↕) is referred to as "a P wave", and light having the linear polarization of the direction perpendicular to the vertical direction (↕) is referred to as "an S wave". Next, the transmitted light (i.e., the P wave) is incident into the wave plate 130, where the λ/4 polarization is provided such that the P wave is changed to light having circular polarization. Next, in the pocket cell 120, the light having circular polarization is changed into an S wave. The S wave is reflected by the rear mirror 110 such that the phase changes by 180 degrees; however, the resulted second S wave (with phase changed by 180 degrees) is incident into the pocket cell 120 to be changed into second light having circular polarization; the second light having circular polarization is incident into the wave plate 130 to be changed into a second P wave. Next, after the second P wave is transmitted through the first polarizer 140, the second P wave is amplified in the oscillator pumping chamber 150 to generate an amplified P wave, and then the amplified P wave is transmitted through the second polarizer 160; as a result, a pulse of high energy is emitted into the front mirror 170. The front mirror 170 partially emits the amplified P wave as a laser beam; the front mirror 170 partially reflects the amplified P wave for enabling the resonance with, for example, subsequent amplified P waves through the above-described path.

Again referring to FIG. 2, the oscillated exposure beam (also referred to as the laser beam) generated in the oscillator 100 is incident into the exposure beam diffusion unit 200. The exposure beam diffusion unit 200 includes a convex lens 220 and a concave lens 210 for enlarging an aperture associated with the exposure beam. The aperture may have different sizes according to different embodiments. In one or more embodiments, the exposure beam diffusion unit 200 may enlarge an exposure beam having an aperture of 5 mm to an exposure beam having an aperture of 9 mm.

The exposure beam transmitted from the exposure beam diffusion unit 200 is incident to the amplifier 300. The amplifier 300 includes a pre-amp pumping chamber 310, a rotator 320, and a post-amp pumping chamber 330. The amplitude of the laser (having a frequency of 5-6 nsec and having a small pulse of 1064 nm) transmitted from the exposure beam diffusion unit 200 is amplified by about 10 times by the inducing emission effect through the two pumping chambers 310 and 330. The rotator 320 has a function of controlling the light axis of the exposure beam.

The light path of the amplified exposure beam is changed by the first bend mirror 410 and the second bend mirror 420. Subsequently, the amplified exposure beam is incident to the high-frequency generator 500.

The high-frequency generator 500 includes a first generator 510 and a second generator 520. The first generator 510 changes the received light (transmitted from the second bend mirror 420) to have a relatively high frequency (and/or a relatively short wavelength) using a second-harmonic generator (SHG), which may double frequencies. The second generator 520 changes the received light (transmitted from the first generator 510) to have a relatively high frequency (and/or a short wavelength) using a third-harmonic generator (THG), which may triple frequencies. The operation of the high-frequency generator 500 will be further described with reference to FIG. 6 and FIG. 7.

Non-linear optical crystallization forms birefringence such that it is possible to change to high frequency through a specific condition by using different refractive indexes in the axis direction in the crystal. In an embodiment of the present invention, an exposure beam having a wavelength of 1064 nm is changed into an exposure beam having a wavelength of 532 nm and an exposure beam having a wavelength of 355 nm using two kinds of non-linear optical crystals.

Figure 6:
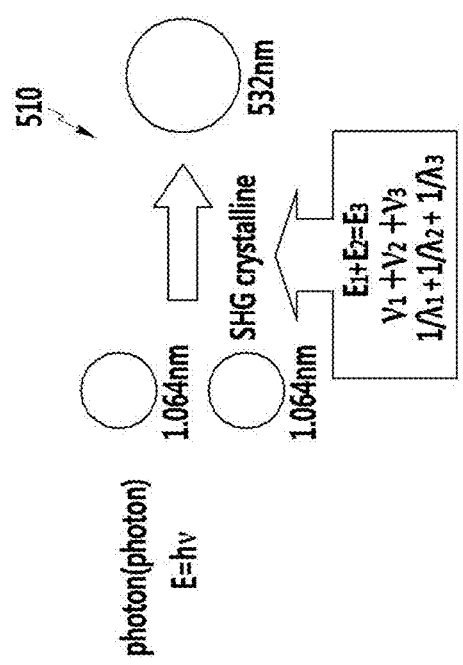

The operation of the first generator 510 is illustrated in FIG. 6. The first generator 510 generates a doubled frequency (associated with ½ of a previous wavelength) using the SHG crystal. In one or more embodiments, as illustrated in FIG. 6, two incident photons of 1064 nm are combined to generate one photon having the half wavelength of 532 nm using the SHG crystal.

Figure 7:
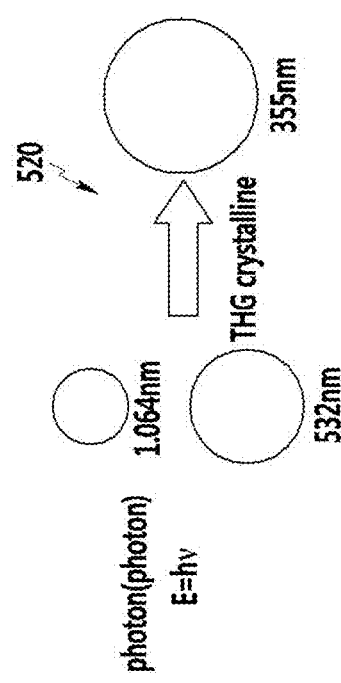
Figure 8:
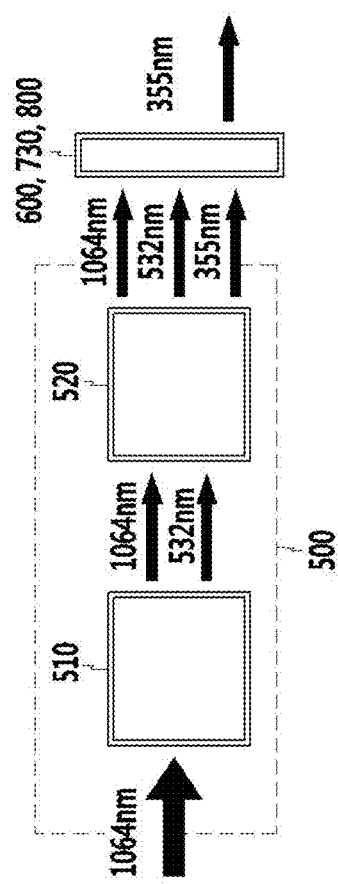

FIG. 7 illustrates the operation of the second generator 520. The second generator 520 generates a tripled frequency (associated with ⅓ the previous wavelength) using the THG crystal. In one or more embodiments, as illustrated in FIG. 7, the incident photons of 1064 nm and 532 nm are combined to generate one photon having a wavelength of 355 nm using the THG crystal.

Through the operation of the first and second generators 510 and 520 shown in FIG. 6 and FIG. 7, the exposure beam having the wavelength of 1064 nm may further have the wavelengths of 532 nm and 355 nm; therefore, the exposure beam may have three wavelengths: 1064 nm, 532 nm, and 355 nm.

The exposure beam transmitted from the high-frequency generator 500 is further processed by the exposure beam diameter changing lens 651, 652, 653, and 654 and the wavelength dividing unit 600.

In one or more embodiments, the exposure beam generator 10 may include the first to fourth exposure beam diameter changing lens 651, 652, 653, and 654. In one or more embodiments, the third and fourth exposure beam diameter changing lens 653 and 654 may not be included, the second and fourth exposure beam diameter changing lens 652 and 654 may not be included, or only the first exposure beam diameter changing lens 651 may be included.

The first exposure beam diameter changing lens 651 is disposed before the wavelength dividing unit 600 (between the wavelength dividing unit 600 and the high-frequency generator 500) and has a concave cylinder lens structure (illustrated in FIG. 11(A)) for enlarging a diameter of the exposure beam (and/or enlarging a cross section the exposure beam along one diameter of the cross section of the exposure beam). The first exposure beam diameter changing lens 651 may be concave with respect to the high-frequency generator 500. The first exposure beam diameter changing lens 651 may be referred to as an exposure beam diameter enlarging lens. FIG. 11(A) illustrates a perspective view of the concave cylinder lens structure, and FIG. 10 illustrates a cross-sectional view (or a side view) of the concave cylinder lens structure. In one or more embodiments, the focus of the concave cylinder lens that functions as the first exposure beam diameter changing lens 651 has a value of −40 mm. In one or more embodiments, the first exposure beam diameter changing lens 651 may enlarge two or more diameters of the exposure beam (and/or may enlarge a cross section of the exposure beam along two or more diameters of the cross section of the exposure beam); for this purpose, the first exposure beam diameter changing lens 651 may have a non-cylinder concave lens structure.

The second exposure beam diameter changing lens 652 is disposed between the first exposure beam diameter changing lens 651 and the wavelength dividing unit 600 before the wavelength dividing unit 600 and has a convex cylinder lens structure (illustrated in FIG. 11(B)) for adjusting and/or reducing the diameter of the exposure beam (i.e., for adjusting and/or reducing a cross section of the exposure bean along one diameter of the cross section of the exposure beam). The second exposure beam diameter changing lens 652 may be convex toward the wavelength dividing unit 600. The second exposure beam diameter changing lens 652 may reduce, adjust, and/or maintain the diameter of the exposure beam that is enlarged by the first exposure beam diameter changing lens 651 such that the exposure beam progresses in parallel (i.e., the diameter of the exposure beam is uniform along the progression direction of the exposure beam). The second exposure beam diameter changing lens 652 may collimate the enlarged exposure beam to provide a collimated exposure beam having substantially constant cross-sectional areas and substantially parallel edges along the progression direction of the collimated exposure beam. The second exposure beam diameter changing lens 652 may be referred to as an exposure beam diameter reducing lens and/or an exposure beam collimating lens. FIG. 11(B) illustrates a perspective view of the convex cylinder lens structure, and FIG. 10 illustrates a cross-sectional view (or a side view) of the convex cylinder lens structure. In one or more embodiments, the focus of the convex cylinder lens that functions as the second exposure beam diameter changing lens 652 has a value of +70 mm. In one or more embodiments, the reducing direction(s) of the diameter of the exposure beam by the second exposure beam diameter changing lens 652 may be aligned with the enlarging direction(s) of the diameter of the exposure beam by the first exposure beam diameter changing lens 651. In one or more embodiments, a same diameter of the exposure beam may be enlarged by the first exposure beam diameter changing lens 651 and subsequently adjusted and/or reduced by the second exposure beam diameter changing lens 652. In one more embodiments, if the first exposure beam diameter changing lens 651 has enlarged two or more diameters of the exposure beam, the second exposure beam diameter changing lens 652 may reduce the two or more diameters of the exposure beam (and/or may reduce a cross section of the exposure beam along two or more diameters of the cross section of the exposure beam); for this purpose, the second exposure beam diameter changing lens 652 may have a non-cylinder convex lens structure.

In one or more embodiments, the second exposure beam diameter changing lens 652 is positioned before the wavelength dividing unit 600 by about 34.2 mm, and the first exposure beam diameter changing lens 651 is positioned before the second exposure beam diameter changing lens 652 by about 10.7 mm and before the wavelength dividing unit 600 by about 44.9 mm.

In one or more embodiments, the third exposure beam diameter changing lens 653 is disposed after the wavelength dividing unit 600 (in view of the progression direction of the exposure beam) and has a convex cylinder lens structure (illustrated in FIG. 11(B)) for adjusting and/or reducing the diameter of the exposure beam transmitted from the wavelength dividing unit 600 (i.e., for adjusting and/or reducing a cross section of the exposure beam along one diameter of the cross section of the exposure beam). The third exposure beam diameter changing lens 653 may be convex toward the wavelength dividing unit 600. The third exposure beam diameter changing lens 653 may be referred to as an exposure beam diameter reducing lens that may further adjust and/or reduce the enlarged diameter of the exposure beam. FIG. 11(B) illustrates a perspective view of the convex cylinder lens structure as shown in, and FIG. 10 illustrates a cross-sectional view (or a side view) of the convex cylinder lens structure. In one or more embodiments, the focus of the convex cylinder lens functioning as the third exposure beam diameter changing lens 653 has the value of +150 mm. In one or more embodiments, the reducing direction of the diameter of the exposure beam by the third exposure beam diameter changing lens 653 may be aligned with the enlarging direction of the diameter of the exposure beam of the first exposure beam diameter changing lens 651. In one or more embodiments, a same diameter of the exposure beam may be enlarged by the first exposure beam diameter changing lens 651 and subsequently adjusted and/or reduced by the third exposure beam diameter changing lens 653. In one or more embodiments, the fourth exposure beam diameter changing lens 654 is disposed after the wavelength dividing unit 600 and is also disposed after the third exposure beam diameter changing lens 653 (in view of the progression direction of the exposure beam). The fourth exposure beam diameter changing lens 654 has a concave cylinder lens structure (illustrated in FIG. 11(A)) for enabling the exposure beam transmitted from the third exposure beam diameter changing lens 653 to progress in parallel (i.e., to have a uniform diameter). The fourth diameter changing lens may collimate the reduced exposure beam transmitted by the third diameter changing lens 653 to provide a collimated exposure beam having substantially constant cross-sectional areas and substantially parallel edges along the progression direction of the collimated exposure beam. FIG. 11(A) illustrates a perspective view of the concave cylinder lens structure, and FIG. 10 illustrates a cross-sectional view of the concave cylinder lens structure. In one or more embodiments, the focus of the convex cylinder lens of the fourth exposure beam diameter changing lens 654 has the value of −100 mm. In one or more embodiments, the direction(s) in which the diameter of the exposure beam is adjusted and/or enlarged by the fourth exposure beam diameter changing lens 654 may be aligned with the direction(s) in which the diameter of the exposure beam is enlarged by the first exposure beam diameter changing lens 651. In one or more embodiments, a same diameter of the exposure beam may be reduced by the third exposure beam diameter changing lens 651 and subsequently adjusted, enlarged, and/or maintained by the fourth exposure beam diameter changing lens 654.

In one or more embodiments, the third exposure beam diameter changing lens 653 is positioned about 36.2 mm from the wavelength dividing unit 600; the fourth exposure beam diameter changing lens 654 is positioned about 84.2 mm after the third exposure beam diameter changing lens 653 and about 120.4 mm after the wavelength dividing unit 600 (in view of the progression direction of the exposure beam).

As illustrated in FIG. 2, the wavelength division unit 600 may include a first prism 610 and a second prism 620, and the wavelength division unit 600 may further include a first dumper 630. The first dumper 630 may be configured for removing light reflected from the first prism 610 for preventing the light from being undesirably emitted outside the exposure beam generator 10.

As illustrated in FIG. 9, the first prism 610 and the second prism 620 of the wavelength division unit 600 provide different paths due to different refractive indexes associated with different wavelengths of light (e.g., 1064 nm, 532 nm, and 355 nm) in the exposure beam. In general, a total reflection surface where the exposure beam is totally reflected in the second prism 620 may be damaged after the second prism 620 has been used for a long period of time. In FIG. 9, the damaged portion is illustrated as X'. In one or more embodiments of the present invention, one or more diameters of the exposure beam is enlarged using the first exposure beam diameter changing lens 651 such that the energy density of the exposure beam is decreased. Advantageously, the potential damage at the total-reflection surface of the second prism 620 may be prevented or substantially delayed. This advantage of the invention is described in detail with reference to figures from FIG. 12 to FIG. 27. In one or more embodiments, the second exposure beam diameter changing lens 652 functions to uniformly maintain the diameter(s) enlarged by the first exposure beam diameter changing lens 651 along the progression direction of the exposure beam.

The exposure beam portion of 532 nm wavelength transmitted from the second prism 620 of the wavelength dividing unit 600 is transmitted to the third and fourth exposure beam diameter changing lens 653 and 654. The third exposure beam diameter changing lens 653 may reduce the diameter of the exposure beam portion emitted from the second prism 620 (to the original diameter length), and the fourth exposure beam diameter changing lens 654 may maintain the diameter of the exposure beam portion (as reduced by the third exposure beam diameter changing lens 653) along the progression direction of the exposure beam portion.

The exposure beam portion of 355 nm wavelength among the exposure beam divided according to the wavelengths is incident to the sampling mirror 710 (after being transmitted through the third and fourth exposure beam diameter changing lens 653 and 654). In one or more embodiment, the distance between (an upper edge of) the sampling mirror 710 and (an upper edge of) the fourth exposure beam diameter changing lens 654) may be about 445 mm. The exposure beam portions of 1064 nm and 532 nm wavelengths may be incident to a second dumper 740 (illustrated in FIG. 2) and may be extinguished. Subsequently, the exposure beam includes the portion of 355 nm wavelength, but not the portions of 1064 nm and 532 wavelengths. A first portion of the exposure beam is reflected by the sampling mirror 710 and is incident to the power monitor 715. A second portion of the exposure beam is transmitted through the sampling mirror 710 and is incident to the output shutter unit 800. The power monitor 715 checks the wavelength and the light amount of the first portion of the exposure beam (which should have a wavelength of 355 nm) to check whether the exposure beam of a ⅓ wavelength is appropriately generated in the second generator 520.

As illustrated in FIG. 2, the output shutter unit 800 includes an output shutter 810. The exposure beam of the 355 nm wavelength transmitted from the sampling mirror 710 is output through the output shutter 810.

Figure 12:
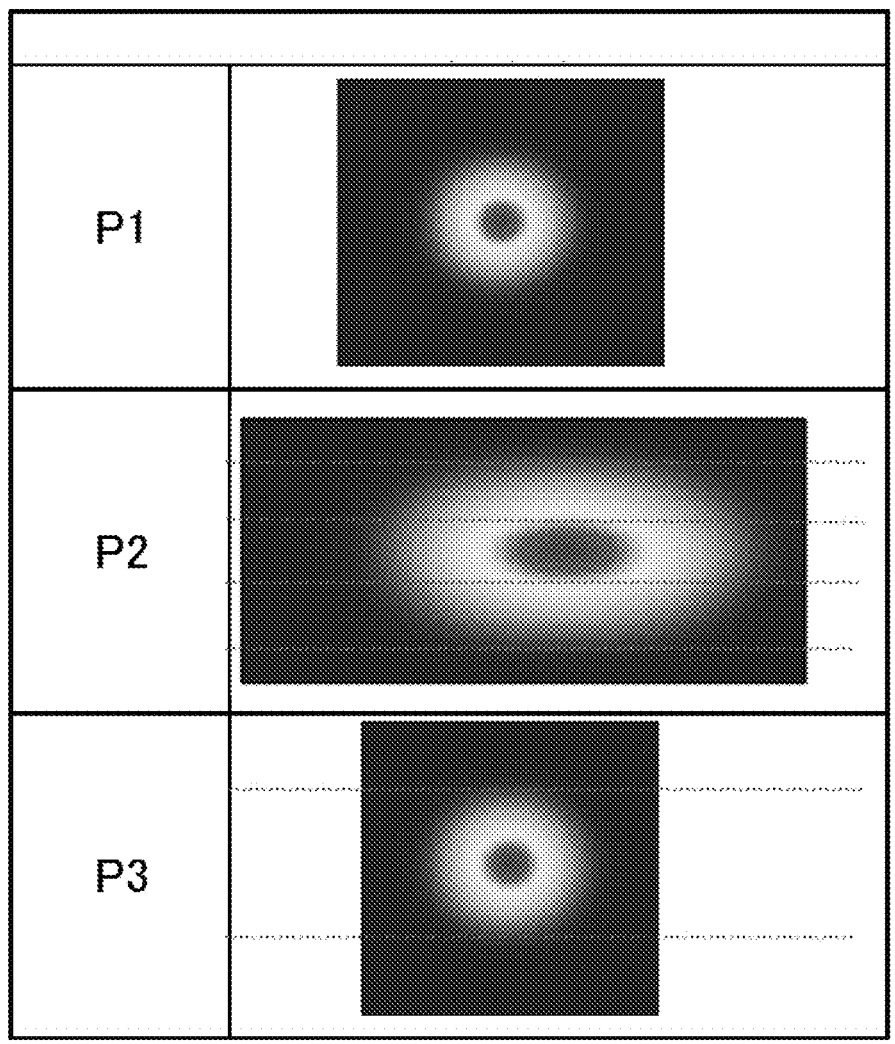
FIG. 12 illustrates cross sections of an exposure beam according to one or more embodiments of the present invention.

FIG. 9 is a side view illustrating the exposure beam diameter changing lens 651, 652, 653, and 654, the wavelength dividing unit 600, and the sampling mirror 710 in a side direction (a z-axis direction). FIG. 10 is a top view illustrating components illustrated in FIG. 9 viewed from a position above the components (in a y-axis direction). In FIG. 9 and FIG. 10, the exposure beam having the wavelength of 355 nm is illustrated. FIG. 12 illustrates that the cross-sectional area of the exposure beam viewed in the transmission direction of the exposure beam is enlarged and reduced by the exposure beam diameter changing lens 651, 652, 653, and 654.

As illustrated in FIG. 10, the diameter of the exposure beam having passed through the first exposure beam diameter changing lens 651 is enlarged in the z-axis direction (including the z direction and/or the −z direction), and then the enlarged diameter that is uniformly maintained by the second exposure beam diameter changing lens 652 to form a collimated exposure beam, which is subsequently transmitted through the first and second prisms 610 and 620. The diameter of the exposure beam transmitted through the first and second prisms 610 and 620 is reduced in the z-axis direction (including the z direction and/or the −z direction) after passing through the third exposure beam diameter changing lens 653. The fourth exposure beam diameter changing lens 654 may collimate the exposure beam such that the diameter of the exposure beam in the z-axis direction remains substantially constant along the transmission direction of the exposure beam after the exposure beam passes the fourth exposure beam diameter changing lens 654.

FIG. 11 is a perspective view illustrating examples of the exposure beam diameter changing lenses. The concave cylinder lens illustrated in FIG. 11(A) illustrates the structure of at least one of the first and fourth exposure beam diameter changing lens 651 and 654. The convex cylinder lens illustrated in FIG. 11(B) illustrates the structure of at least one of the second and third exposure beam diameter changing lens 652 and 653.

FIG. 12 illustrates cross sections of the exposure beam at three positions illustrated in FIG. 9 and FIG. 10.

The exposure beam cross section illustrated in P1 of FIG. 12 is a cross section of the exposure beam incident to the first exposure beam diameter changing lens 651. As illustrated in P1 of FIG. 12, the cross section of the light incident to the first exposure beam diameter changing lens 651 has a circular shape, wherein the diameter of the cross section in the up and down direction (i.e., in the +y/−y direction according to FIG. 9) is substantially equal to the diameter of the cross section in the right and left direction (i.e., in the +z/−z direction according to FIG. 10).

The exposure beam cross section illustrated in P2 of FIG. 12 is a cross section of an exposure beam at the total reflection surface of the second prism 620 (illustrated in FIG. 9). As can be appreciated from a comparison of P2 and P1 of FIG. 12, for the exposure beam incident to the total reflection surface of the second prism 620, the cross section is enlarged along a diameter in the right and left direction (+z/−z direction). As a result, the energy density of the exposure beam is decreased. Advantageously, the total reflection surface of the second prism 620 may not be damaged by the exposure beam. In one or more embodiments, the first exposure beam diameter changing lens 651 may enlarge the cross section area of the exposure beam (viewed in the transmission direction of the exposure beam) along one or more diameters of the cross section (e.g., along a diameter in the right and left direction) for reducing the energy density of the exposure beam before the exposure beam is incident to the total reflection surface of the second prism 620 such that the total reflection surface is not damaged. Advantageously, the usable life of the second prism 620 may be prolonged, and consistent exposure beam quality may be provided in manufacturing display devices.

The exposure beam cross section illustrated in P3 of FIG. 12 is the cross section of the exposure beam pictured in the power monitor 715 (illustrated in FIG. 2) after the diameter and/or the cross section of the exposure beam have been further controlled by the third and fourth exposure beam diameter changing lens 653 and 654. The exposure beam associated with P3 of FIG. 12 is substantially equivalent to the exposure beam that is transmitted through the sampling mirror 710 and is emitted by the exposure beam generator 10. As can be appreciated from P3 of FIG. 12, for the exposure beam emitted by the exposure beam generator 10, the diameter of the cross section in the up and down direction is substantially equal to the diameter of the cross section in the right and left direction. Before the exposure beam generator 10 emits the exposure beam, the third exposure beam diameter changing lens 653 has reduced the cross-sectional area of the exposure beam such that the exposure beam has a sufficiently high energy density.

The cross sections of the exposure beam illustrated in FIG. 12 are results of enlarging and reducing the diameter(s) and the cross-sectional area of the exposure beam using one or more of the first to fourth exposure beam diameter changing lens 651, 652, 653, and 654 according to one or more embodiments of the present invention.

In contrast, a exposure beam generator would not have included the first to fourth exposure beam diameter changing lens 651, 652, 653, and 654. Therefore, in a exposure beam generator, the total reflection surface of a prism may tend to be damaged after the prism has been used for an extended period of time, as discussed with reference to FIG. 13 to FIG. 20.

Figures from FIG. 13 to FIG. 20 are schematic representations illustrating one or more simulation and/or experimentation results of damage generated in one or more exposure beam generators.

Figure 13:
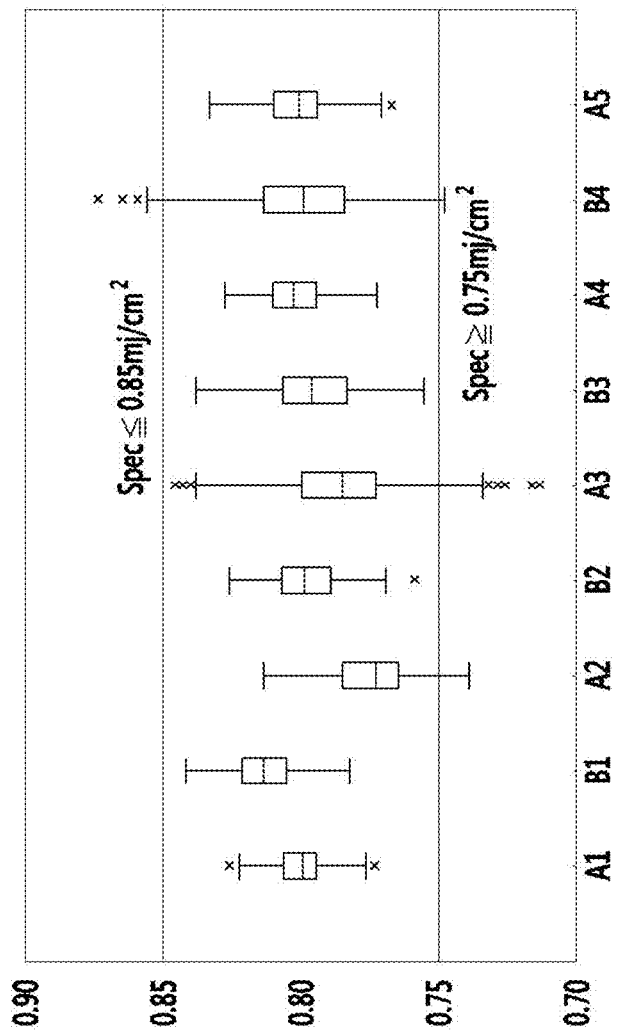
FIG. 13, FIG. 14, FIG. 15, FIG. 16, FIG. 17, FIG. 18, FIG. 19, and FIG. 20 illustrate one or more simulation and/or experimentation results of damage generated in one or more exposure beam generators.

FIG. 13 illustrates degrees of damage generated at total reflection surfaces of prisms, indicated by the energy densities of the light beams transmitted by the total reflection surfaces, after conventional exposure beam generators have been continuously lit for 30 days. In FIG. 13, the horizontal axis represents a total of nine conventional exposure beam generators as experimental objects, and the vertical axis represents energy density values of reflected light beams, or illumination distribution characteristics. The nine conventional exposure beam generators are indicated by A1, A2, A3, A4, A5, B1, B2, B3, and B4. As indicated in FIG. 13, a range of 0.75 to 0.85 mj/cm$^2$ is a specified permissible range for the energy density of a light beam transmitted from a total reflection surface of an exposure beam generator. As can be appreciated from FIG. 13, the conventional exposure beam generators A2, A3, and B4 have values beyond the permissible range as a result of significant damages at the total reference surfaces of the exposure beam generators A2, A3, and B4. Although the other six conventional exposure beam generators values within the permissible range, the energy densities (or the illumination distribution) of the light beams provided by the six conventional exposure beam generator may deviate from the permissible range when the six conventional exposure beam generators are used for longer than 30 days.

Degrees of damage associated with the experimental objects of FIG. 13 are schematically represented in Table 1 as follows.

TABLE 1

| | A1 | A2 | A3 | A4 | A5 | B1 | B2 | B3 | B4 |
|---|---|---|---|---|---|---|---|---|---|
| Damage degree | small | small | large | small | small | small | small | small | small |

Figure 14:
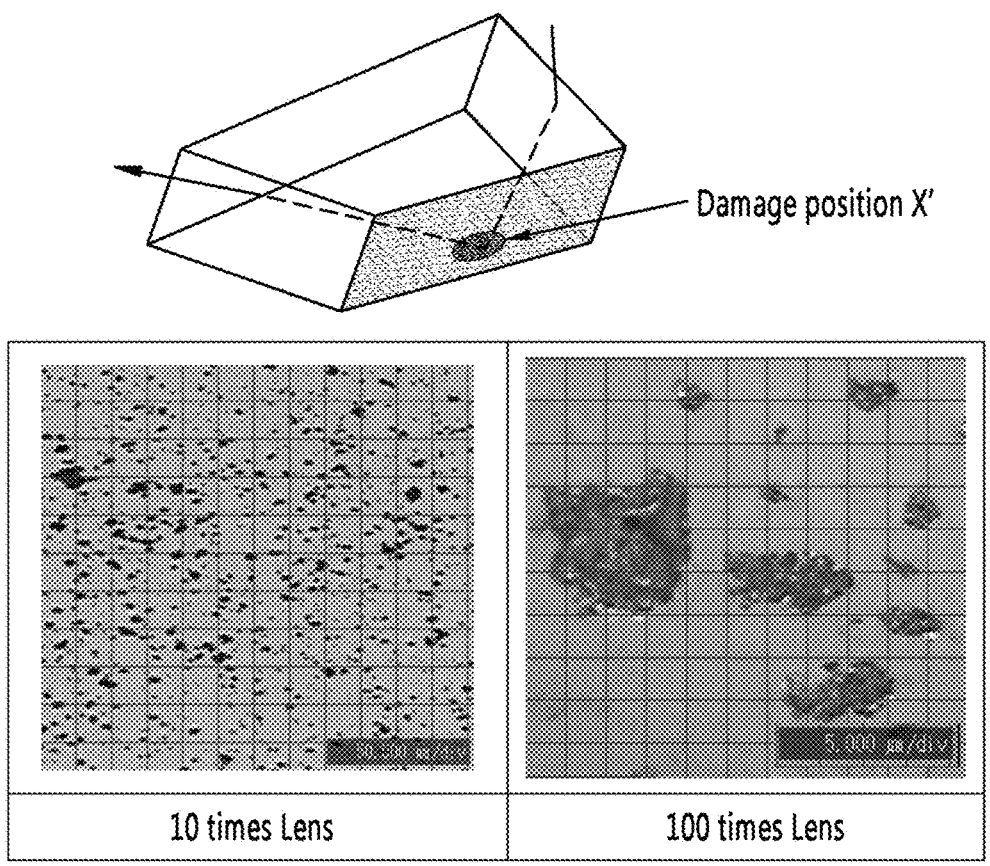

FIG. 14 includes electron microscope images illustrating damage at a prism of a conventional exposure beam generator. The damage, such as a scratch or a hole at position X', may substantially reduce the energy density of the exposure beam emitted from the conventional exposure beam generator.

FIG. 14 shows enlarged images of damage viewed through electronic microscopic lens with 10 times and 100 times magnification. The damage may have a size of 2-15 μm.

A reason that the damage shown in FIG. 14 is generated at the total reflection surface of the second prism 620 in a exposure beam generator will be described with reference to FIG. 15 to FIG. 20.

Figure 15:
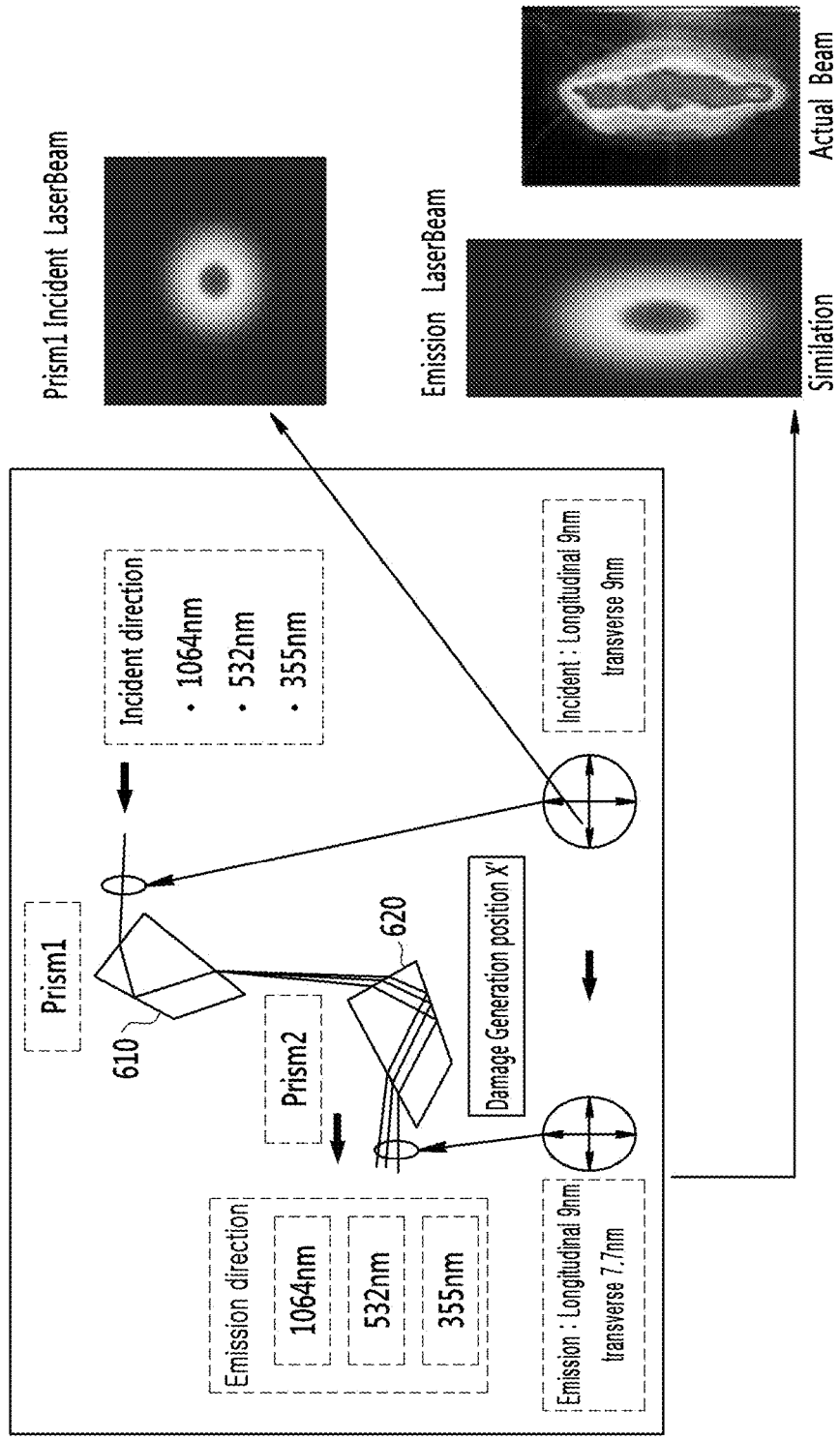

FIG. 15 illustrates diameters and cross sections of an exposure beam at the first prism 610 and the second prism 620 of a wavelength dividing unit of a exposure beam generator.

As illustrated in FIG. 15, the exposure beam incident to the first prism 610 has a circular cross section having a dimension of 9 mm for each of a longitudinal (or vertical) diameter and a transverse (or horizontal) diameter. The cross section of the exposure beam having passed through the second prism 620 also may have a longitudinal diameter of 9 mm, but may have an elliptical shape such that the transverse diameter may be reduced by 1.3 mm to 7.7 mm. FIG. 15 shows a simulation image and an actual image of an exposure beam (shown as an emitted laser beam) emitted from the second prism 620, each having an elongated shape in the vertical direction. Nevertheless, the actual image shows an irregular shape rather than an elliptical shape and indicates that the total reflection surface of the second prism 620 has been damaged. In one or more experiments, the actual measured case has a flattened shape (rather than the elliptical shape elongated in the vertical direction) and indicates that damage has been generated at the total reflection surface of the second prism 620.

As described above, if the diameter (or cross section) of the exposure beam is small, the energy density of the exposure beam may be substantially high such that a possibility of damaging the total reflection surface of the second prism 620 is increased.

Comparing FIG. 12 and FIG. 15, the light incident to the first exposure beam diameter changing lens 651 represented by P1 of FIG. 12 may be equivalent to the light incident to the first prism 610 of FIG. 15. Nevertheless, the light incident to the total reflection surface of the second prism 620 (which has been diffused by the first exposure beam diameter changing lens 651) represented by P2 of FIG. 12 has a horizontal diameter (and a cross-sectional area) that may be significant larger than the horizontal diameter (and the cross-sectional area) of the light incent to the total reflection surface of the second prism 620 illustrated in FIG. 15. Therefore, the total reflection surface in accordance of embodiments of the invention receives an exposure beam that has substantially lower energy density and does not cause damage. In contrast, an exposure beam of substantially higher energy density is incident to the total reflection surface of the exposure beam generator such that the damage is generated.

Simulations related to the damage in the second prism 620 of a exposure beam generator will be described with reference to FIG. 16 to FIG. 20.

Figure 16:
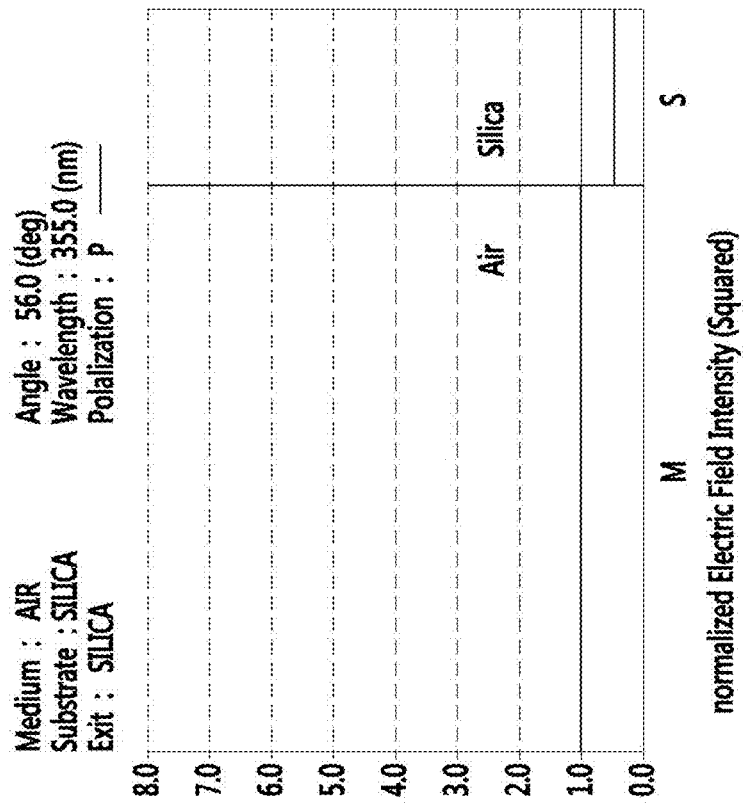
Figure 17:
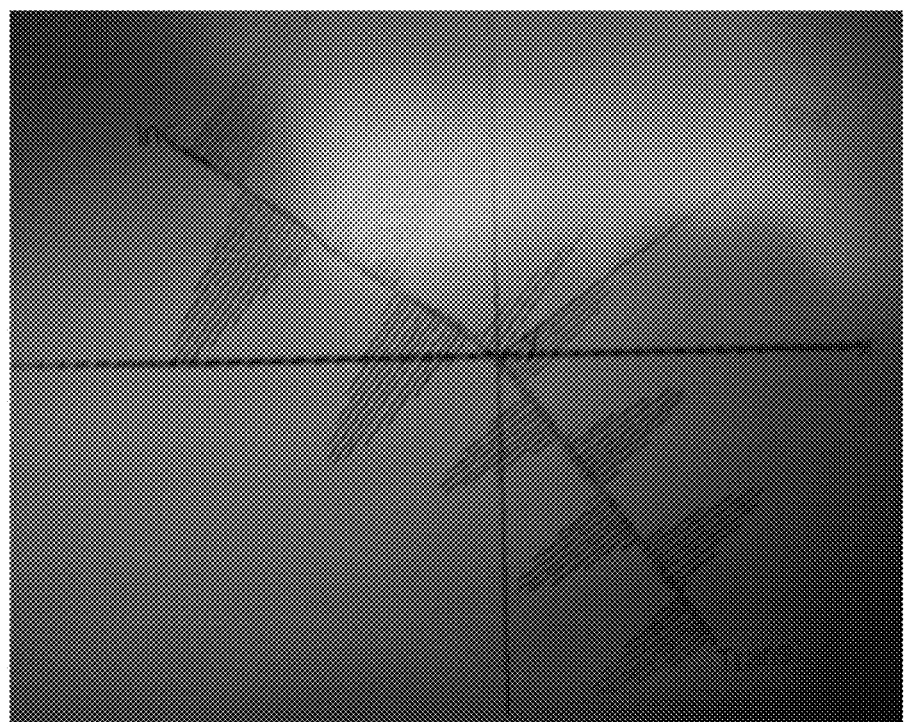

FIG. 16 and FIG. 17 illustrate a simulation of energy at a surface ("interface-1") where the exposure beam is incident to the second prism 620. In FIG. 16, parameter values for the simulation are described: the prism is formed of silica, the wavelength is 355 nm, and an incident angle of the exposure beam is 56 degrees.

The reflection and transmission of an electromagnetic wave are illustrated in FIG. 17. The intensity ratio of the energy is represented in the graph of FIG. 16 and a lower table of FIG. 17. If the energy of the wave in air is referred to as 1, the energy of the wave incident to the second prism 620 is 0.458.

Figure 18:
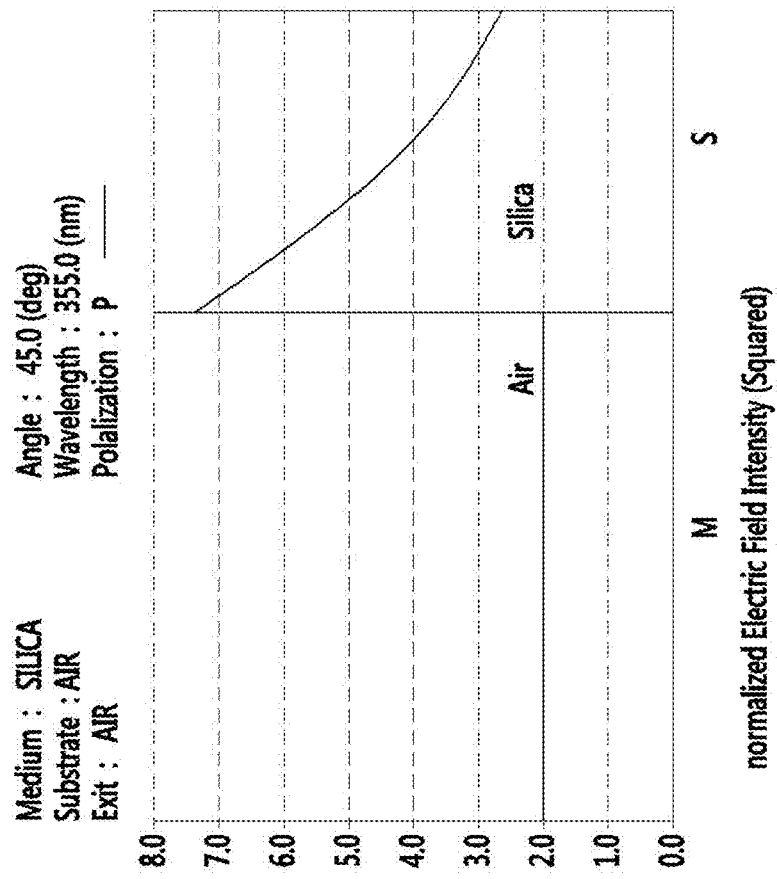
Figure 19:
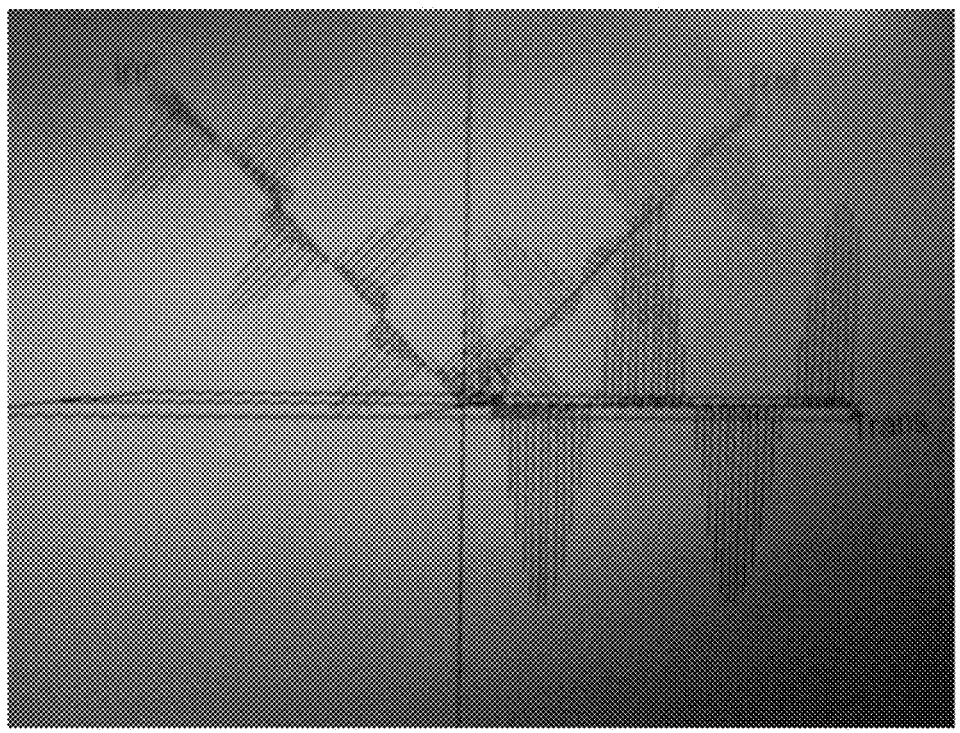

FIG. 18 and FIG. 19 illustrate a simulation of energy at the total reflection surface ("interface-2") of the second prism 620 of the exposure beam generator. FIG. 18 describes parameter values for the simulation: an incident angle to the total reflection surface ("interface-2") is set as 45 degrees. The total reflection of the electromagnetic wave is illustrated in FIG. 19. The intensity ratio of the energy is shown in the graph of FIG. 18 and a lower table of FIG. 19. According to the lower table of FIG. 19, if the energy incident to the total reflection surface ("interface-2") in the second prism 620 is 0.458, the energy provided to the total reflection surface is 1.695. As can be appreciated from the simulations, if the energy of the light incident to the second prism 620 is referred to as 1, the total reflection surface receives the energy of 1.695, which is substantially higher than in the input light. As a result, damage is typically generated at the total reflection surface.

Figure 20:
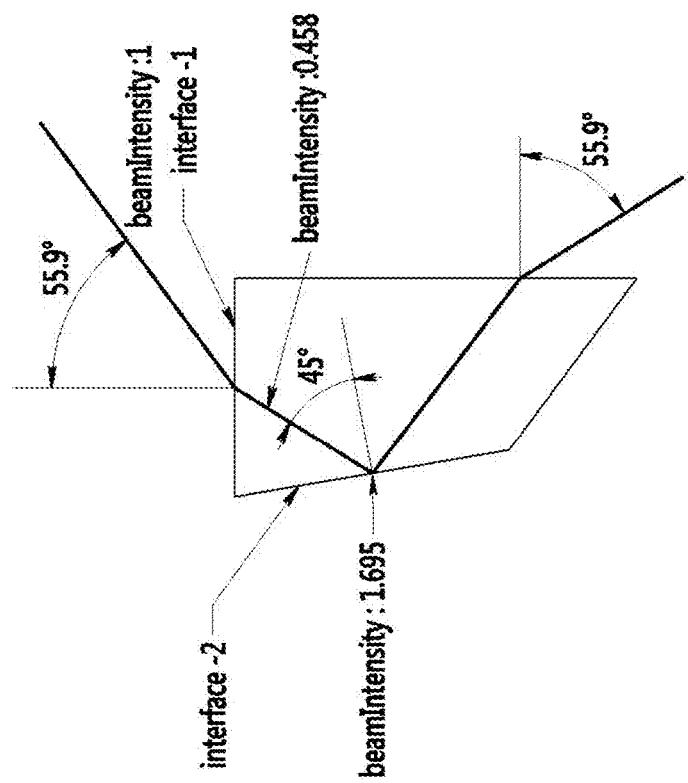

FIG. 20 illustrates an incident angle, total reflection, emission of the exposure beam, and energy beam intensity associated with a prism of a exposure beam generator in the simulations discussed with reference to FIGS. 16-19.

As shown in the figures from FIG. 15 to FIG. 20, given the small diameter of the horizontal axis of the exposure beam, high-intensity energy is received at the total reflection surface of the prism of the exposure beam generator. As a result, damage tends to occur at the total reflection surface of the prism after the prism has been used for a long period of time.

In one or more embodiments of the present invention, the first exposure beam diameter changing lens 651 is positioned before the first prism 610 (referring to FIG. 9 and FIG. 10) by a predetermined distance (in view of the transmission direction of the exposure beam) for enlarging a horizontal axis of a cross section of the exposure beam. As a result, the energy density of the exposure beam received by the second prism 620 is reduced. Advantageously, damage at the total reflection surface of the second prism 620 may be avoided even if the second prism 620 is used for a long period of time.

According to one or more embodiments, the second, third, and fourth exposure beam diameter changing lens 652, 653, and 654 may be further included. The second exposure beam diameter changing lens 652 may collimate the exposure beam before the exposure beam is incident to the first prism 610. The third exposure beam diameter changing lens 653 may reduce the diameter (and the cross-section area) of the exposure beam transmitted from the second prism 620, thereby recovering the energy density reduced by the first exposure beam diameter changing lens 651. The fourth exposure beam diameter changing lens 654 may collimate the exposure beam transmitted from the third exposure beam diameter changing lens 653 before the exposure beam is emitted from the exposure beam generator 10.

Distances related to the first to fourth exposure beam diameter changing lens 651, 652, 653, and 654 and the prisms 610 and 620 may have various values according to various embodiments. The exposure beam may have various characteristics according to the optical characteristics of the exposure beam diameter changing lenses in various embodiments.

In one or more embodiments, distance positioning of the exposure beam diameter changing lens may be changed such that the characteristic of the exposure beam may be appropriately changed by, for example, relatively changing one or more of the distances between the exposure beam diameter changing lenses and the first and second prisms 610 and 620.

Figure 22:
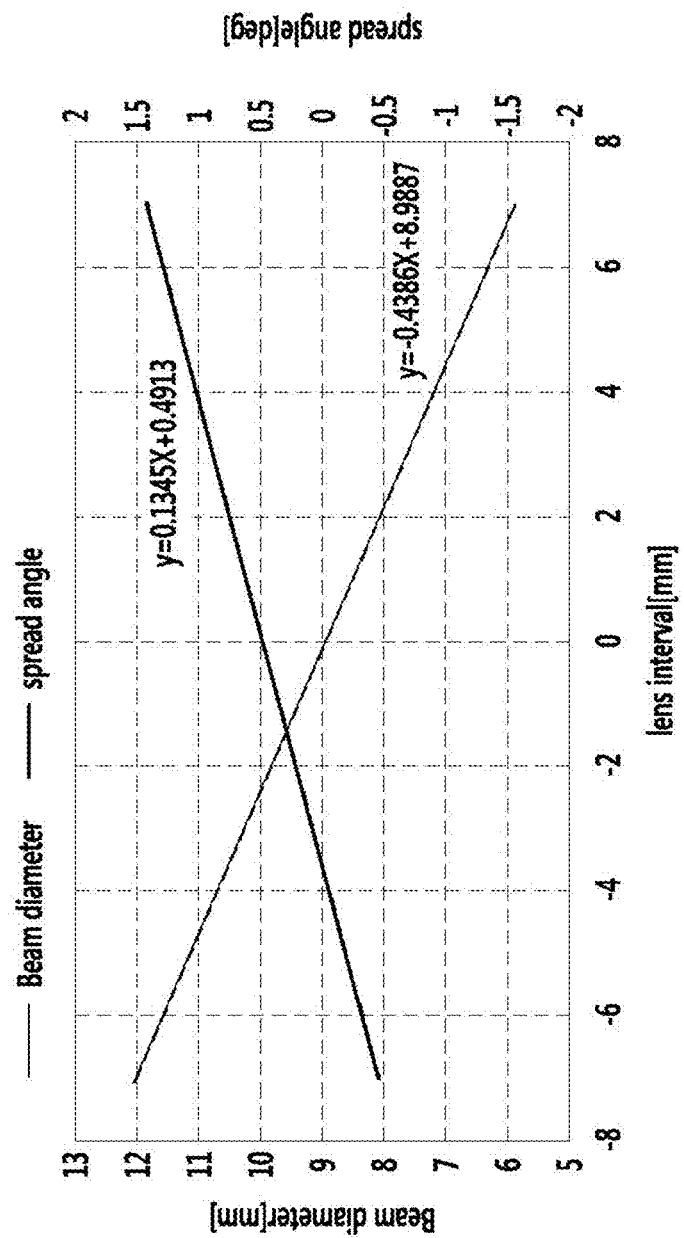

FIG. 21 and FIG. 22 illustrate a change of diameter and spread angle of the exposure beam according to the change of the lens interval of the first and second exposure beam diameter changing lens 651 and 652.

FIG. 21 illustrates simulations of values of a beam diameter and a spread angle of an exposure beam when the lens interval of the first exposure beam diameter changing lens 651 and the second exposure beam diameter changing lens 652 is changed from 7 mm to −7 mm by 1 mm units. In FIG. 21, when the lens interval is 0, as shown in FIG. 9, the second exposure beam diameter changing lens 652 is away from the first prism 610 by 34.2 mm, and the first exposure beam diameter changing lens 651 is away from the second exposure beam diameter changing lens 652 by 10.7 mm. When changing the lens by the interval of 1 mm, in the state that the second exposure beam diameter changing lens 652 is fixed, the first exposure beam diameter changing lens 651 is moved further away from the second exposure beam diameter changing lens 652 by a 1 mm increment. A negative value of the lens interval of the first exposure beam diameter changing lens 651 and the second exposure beam diameter changing lens 652 means that the distance between the first exposure beam diameter changing lens 651 and the second exposure beam diameter changing lens 652 becomes smaller.

A graph of the results of simulations according to FIG. 21 is shown in FIG. 22.

FIG. 22 shows a straight line for the diameter of the exposure beam and a straight line for the spread angle, each presenting a function of the lens interval, wherein the lens interval represents the change of difference between the first exposure beam diameter changing lens 651 and the second exposure beam diameter changing lens 652 from the distance 34.2 mm.

The straight line for the diameter of the exposure beam may be represented by Equation 1 below:

$$y=-0.4386x+8.9887, \quad \text{[Equation 1]}$$

wherein x is the lens interval, and y is the diameter of the exposure beam.

As can be appreciated from Equation 1, the diameter of the exposure beam is decreased as the lens interval is increased.

The straight line for the spread angle may be represented by Equation 2 below:

$$y=0.1345x+0.4913, \quad \text{[Equation 2]}$$

wherein x is the lens interval, and y is the spread angle.

As can be appreciated from Equation 2, the spread is increased as the lens interval is increased.

In one or more embodiments of the present invention, it is important that the diameter of the exposure beam is not reduced as opposed to the spread angle. The lens interval may be optimized according to at least Equation 1.

The range of the diameter of the exposure beam will be described with reference to FIG. 23 and FIG. 24.

Figure 23:
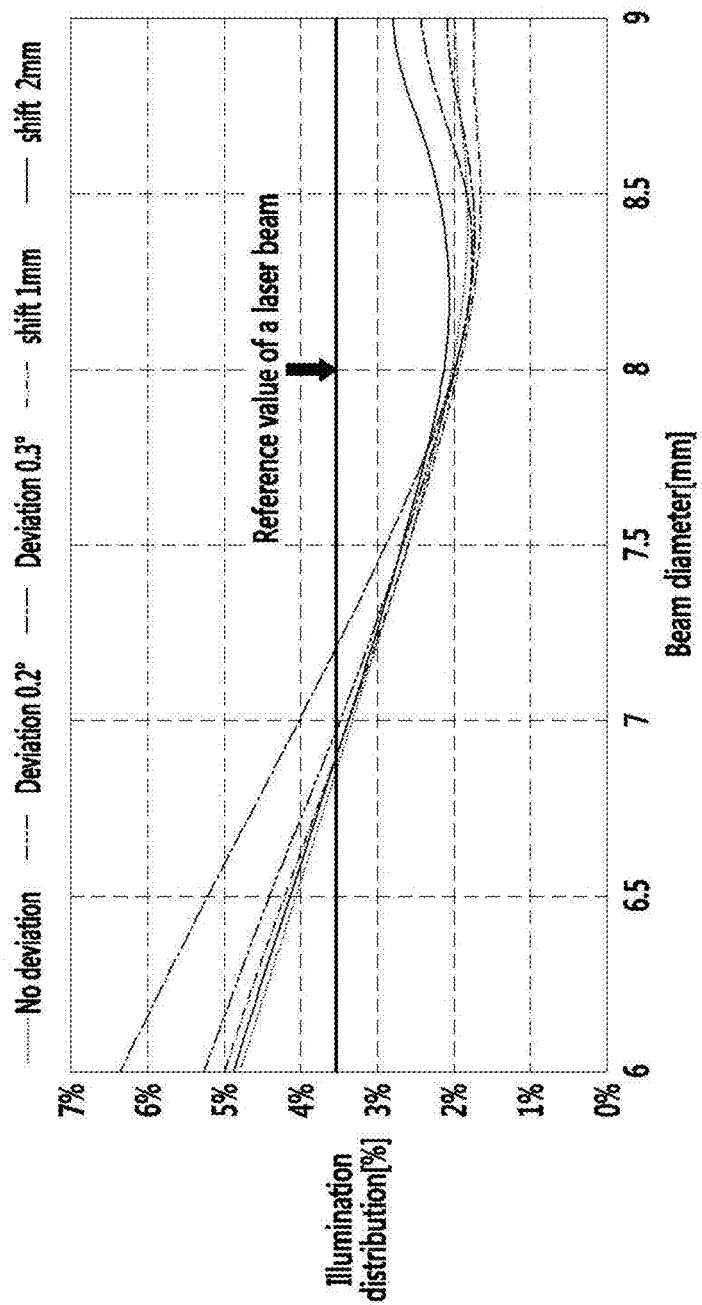
Figure 24:
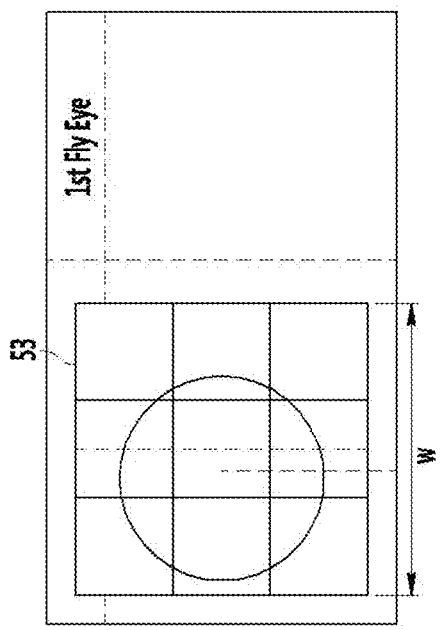

FIG. 23 illustrates illumination distribution according to the diameter of the exposure beam. According to FIG. 23, illumination distribution is less than 3.5% (a reference value) if the diameter of the exposure beam is more than about 7.5 mm. According to FIG. 23, although the light axis is deviated or the exposure beam may be shifted, if the diameter of the exposure beam is about 8 mm, the illumination distribution is substantially most stable in view of the possible deviation and shift. In contrast, if the diameter of the exposure beam is about 7.5 mm, a decrease in the diameter of the exposure beam may significantly increase the energy density such that the total reflection surface of the second prism 620 may be damaged. Therefore, in one or more embodiments, an exposure beam diameter of more than 8 mm is preferable. In one or more embodiments of the present invention, the diameter of the exposure beam incident to the first prism 610 is 9 mm such that the illumination distribution is substantially stable even if the diameter is decreased by about 1 mm. Advantageously, damage to the second prism 620 may be prevented.

The maximum value of the exposure beam diameter will be described through FIG. 24. FIG. 24 illustrates a front view the first fly eye lens 53 of the light exposer 1 viewed from the transmission direction of the exposure beam. As illustrated in FIG. 24, the exposure beam is received by the first fly eye lens 53. In one or more embodiments, the exposure beam must be smaller than the width w of the first fly eye lens 53. In one or more embodiments, the maximum value of the diameter of the exposure beam is preferably smaller than the width w of the fly eye lens by at least 1 mm. In one or more embodiments, the width w of the first fly eye lens 53 is 12 mm, and the maximum value of the exposure beam may be 11 mm.

Characteristic of the exposure beam emitted from the exposure beam generator 10 according to one or more embodiments of the present invention will be described with reference to FIG. 25 to FIG. 27.

Figure 25:
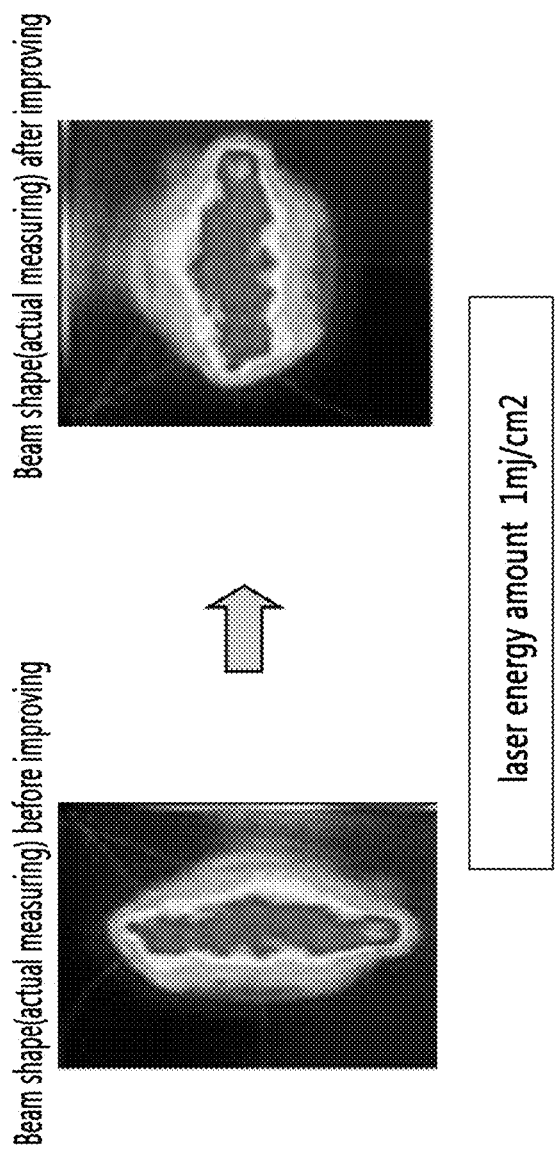

In FIG. 25, a cross section of an exposure beam measured at the total reflection surface of a prism of a exposure beam generator is shown at the left side of FIG. 15, and a cross section of an exposure beam at the total reflection surface the second prism 620 according to an embodiment of the present invention is shown at the right side.

As illustrated in the left side of FIG. 25, the width of the exposure beam in the horizontal direction is decreased such that the cross-sectional area is reduced and that the energy density is increased. In contrast, as illustrated in the right side according to an embodiment of the present invention, the width of the exposure beam is widened enough in the horizontal direction such that the energy density is decreased. Therefore, according to embodiments of the invention, the likelihood of damage is relatively low because of the relatively low energy density at the total reflection surface of the second prism 620. At the right side of FIG. 25, although the height in the vertical direction seems relatively small, the height is within the predetermined permissible range, such that the cross-sectional area is sufficiently large and that the energy density is sufficiently low to prevent damage at the total reflection surface. In one or more embodiments, decrease in a dimension of the cross section of the exposure beam may be compensated through adjusting the lens interval.

Figure 26:
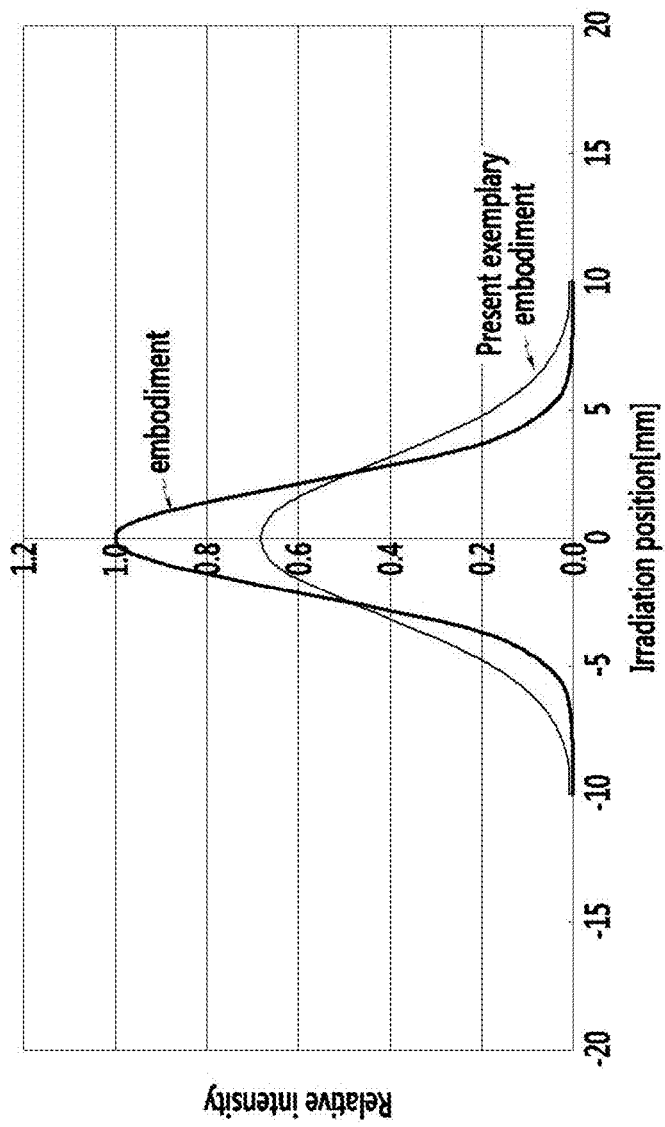

FIG. 26 illustrates graphs of energy intensity at a total reflection surface for the two cases in FIG. 25. According to an embodiment of the present invention, the overall energy intensity is relatively low and relatively widely distributed. Therefore, according to one or more embodiments, damage at the total reflection surface may be relatively small or may be prevented.

Figure 27:
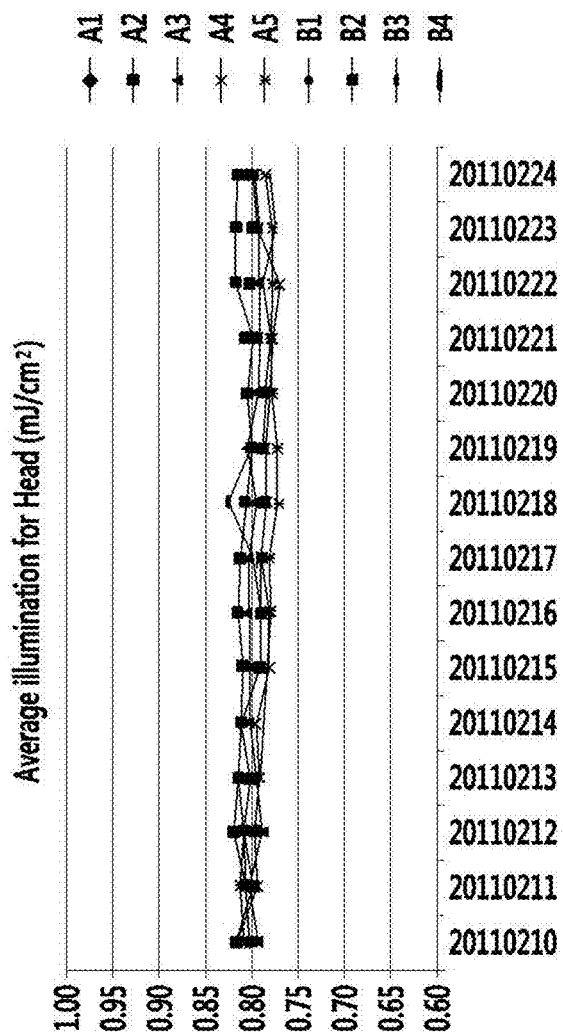

FIG. 27 illustrates a change of the average illumination of each exposure beam generator discussed with reference to FIG. 13 given that the exposure beam diameter changing lenses according to one or more embodiments of the invention are added to the exposure beam generator and that the exposure beam generator is used for 15 days. As can be appreciated from FIG. 27, the substantially constant average illumination indicates that no substantial damage is generated at the total reflection surface of the second prism in the exposure beam generator.

A controlling method of a light exposer according to an embodiment of the present invention will be described with reference to FIG. 28.

Figure 28:
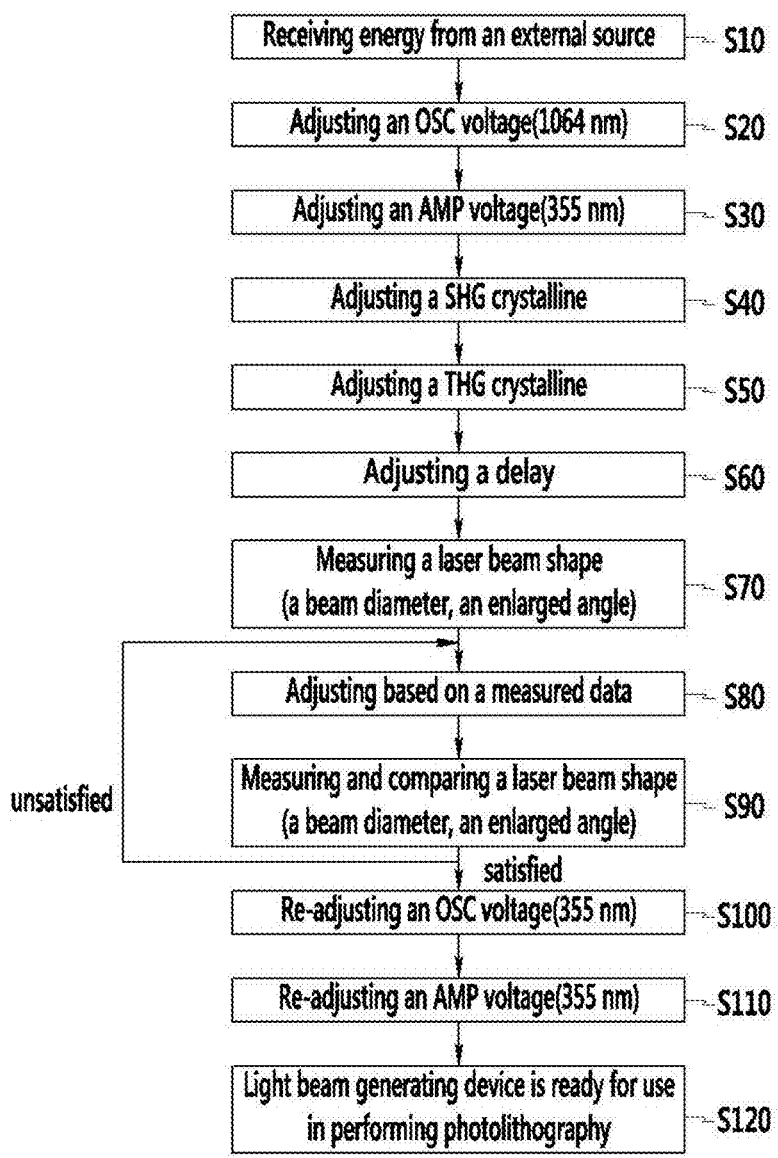
FIG. 28 is a flowchart illustrating a method for configuring a light exposer according to an embodiment of the present invention.

FIG. 28 is a flowchart illustrating a method for configuring a light exposer (e.g., the light exposer 1 illustrated in FIG. 1) according to an embodiment of the present invention.

According to FIG. 28, in step S10, the oscillator 100 of the exposer 1 may receive energy from an external source for subsequently generating a laser beam.

In step S20, the voltage of the oscillator (OSC) pumping chamber 150 of the oscillator 100 may be adjusted to generate a laser with a wavelength of 1064 nm. The laser may be monitored using a monitor unit (not shown) configured for monitoring the 1064 nm wavelength and disposed in the oscillator 100. In step S30, the voltage of the pre-amp pumping chamber 310 and the post-amp pumping chamber 330 may be adjusted to generate a laser of 355 nm wavelength. The generated laser may be monitored using a monitor unit (not shown) configured for monitoring the 355 nm wavelength and disposed in the amplifier 300 (S30).

In step S40, the angle of an SHG crystal may be adjusted in the first generator 510 of the high-frequency generator 500 to generate a laser with a wavelength of 532 nm.

In step S50, the angle of a THG crystal may be adjusted in the second generator 520 of the high-frequency generator 500 to generate a laser with the wavelength of 355 nm.

In step S60, emission timing of the laser beam (which includes at least a laser generated in the preceding steps) is controlling by adjusting a delay value that is set up in the light exposer 1 to emit an optimized laser beam. In one or more embodiments, the step of adjusting the delay value may be omitted. In one or more embodiments the step of adjusting the delay value may be performed according to a sequence different from the sequence illustrated by the flowchart shown in FIG. 28.

In step 70, a shape of the laser (exposure) beam is measured. A method of measuring the shape of the exposure beam may include picturing a cross section of the exposure beam using a picturing device (e.g., a camera). The diameter of the cross section of the exposure beam is measured using the pictured image, and an enlarged angle of the exposure beam may be measured, calculated, and/or derived from the pictured image.

In step S80, one or more lens intervals or distances associated with the exposure beam diameter changing lenses may be adjusted in view of the shape of the exposure beam, represented by, for example, one or more values of the diameter of the exposure beam and the enlarged angle of the exposure beam (obtained from step S70). Alternatively or additionally, one or more of the exposure beam diameter changing lenses may be replaced with one or more lenses having one or more different optical characteristics in view of the shape of the exposure beam (e.g., represented by the diameter value and/or the enlarged angle value).

In Step 90, the shape of the exposure beam is again measured. If it is determined that the shape (e.g., the diameter) of the exposure beam is still not in a predetermined range, the step S80 of adjusting the exposure beam diameter changing lens(es) is further performed.

If the result of re-measuring (step S90) is satisfactory, the voltage of the oscillator (OSC) pumping chamber 150 of the oscillator 100 is re-adjusted in step S100. In step S110, the voltages of the pre-amp pumping chamber 310 and the post-amp pumping chamber 330 of the amplifier 300 are re-adjusted. In the step of re-adjusting the voltage of the oscillator (OSC) pumping chamber 150 (S100) and the step of re-adjusting the voltage of the pre-amp pumping chamber 310 and the post-amp pumping chamber 330 of the amplifier 300 (S110), voltages are adjusted based on whether the laser generated using the THG has the required wavelength of 355 nm wavelength. In one or more embodiments, these re-adjusting steps S100 and S110 may be omitted. In one or more embodiments, only one of the two re-adjusting steps S100 and S110 is performed.

After the above steps have been performed, in step S120, the light exposer 1 may be ready for use in performing photolithography.

FIG. 29 illustrates an exposure process of a scan method according to an embodiment of the present invention.

FIG. 29 illustrates a process of exposing a mother substrate 2000 using a small mask 1000 corresponding to a portion of the mother substrate 2000 (also indicated by "Glass" in FIG. 29). Although the small mask 1000 covers only a portion of the mother substrate 200 at a point of time, the exposure process progresses with the substrate 2000 and the mask 1000 being relatively moved such to the exposure process may be performed with the small mask 1000 on the entire region of the mother substrate 2000. The small mask 1000 may include a plurality of mask patterns for exposing a plurality of display device units. A mask pattern is illustrated in an enlarged view at the right sided of FIG. 29.

In one or more embodiments, the exposure process progresses with the small mask being aligned with reference to an alignment key (e.g., a black matrix that is formed in the mother substrate).

While this invention has been described in connection with what is presently considered to be practical embodiments, it is to be understood that the invention is not limited to the disclosed embodiments. The invention is intended to cover various modifications and equivalent arrangements included within the spirit and scope of the appended claims.

DESCRIPTION OF SYMBOLS

1: light exposer
10: exposure beam generator
20: first mirror
30: exposure beam monitor unit
second mirror 40
vacuum chamber 50
first chamber window 51
first light path difference plate 52
53: first fly eye lens
54: second chamber window
60: plane parallel rotation plate
70: optical unit
71: first light collecting lens
72: second light path difference plate
73: second fly eye lens
80: third mirror
90: second light collecting lens
100: oscillator
110: rear mirror
120: pocket cell
130: wave plate
135: Q switch
140: first polarizer
150: oscillator pumping chamber
160: second polarizer
170: front mirror
200: exposure beam diffusion unit
210: concave lens
220: convex lens
300: amplifier
310, 330: amp pumping chamber
320: rotator
410: first bend mirror
420: second bend mirror
500: high-frequency generator
510: first generator
520: second generator
600: wavelength dividing unit
610: first prism
620: second prism
630: first dumper
651, 652, 653, 654: exposure beam diameter changing lens
710: sampling mirror
715: power monitor
740: second dumper
800: output shutter unit
810: output shutter
1000: mask
2000: substrate

What is claimed is:

1. A light exposer comprising:
an exposure beam generator generating an exposure beam; and
a vacuum chamber passing the exposure beam generated by the exposure beam generator and comprising a first fly eye lens having a plurality of convex lens like fly eyes,
wherein the exposure beam generator comprises
an oscillator comprising an oscillator pumping chamber,
a first prism and a second prism, and
a first exposure beam diameter changing lens positioned before the first prism and enlarging a diameter of the exposure beam.

2. The light exposer of claim 1, wherein
the first exposure beam diameter changing lens has a concave cylindrical lens structure.

3. The light exposer of claim 2, wherein
the exposure beam generator further comprises a third exposure beam diameter changing lens positioned after the second prism and reducing the diameter of the exposure beam, and
the third exposure beam diameter changing lens has a convex cylindrical lens structure.

4. The light exposer of claim 3, wherein
a direction that the second exposure beam diameter changing lens reduces the diameter of the exposure beam is the same as a direction that the first exposure beam diameter changing lens enlarges the diameter of the exposure beam.

5. The light exposer of claim 3, wherein
the diameter of the exposure beam according to a lens interval of the first exposure beam diameter changing lens and the second exposure beam diameter changing lens satisfies an equation below:

$$y=-0.4386x+8.9887$$

wherein x is a lens interval and y is a diameter of the exposure beam.

6. The light exposer of claim 5, wherein
the diameter of the exposure beam has a minimum value when an illumination distribution of the exposure beam is most stable, and a maximum value that is less than the width of the first fly eye lens by 1 mm.

7. The light exposer of claim 6, wherein
the diameter of the exposure beam is more than 8 mm to less than 11 mm.

8. The light exposer of claim 5, wherein
the distance between the first exposure beam diameter changing lens and the first prism is 44.9 mm, and the distance between the third exposure beam diameter changing lens and the second prism is 36.2 mm.

9. The light exposer of claim 3, wherein
the exposure beam generator further comprises
a second exposure beam diameter changing lens positioned after the first exposure beam diameter changing lens and maintaining the diameter of the exposure beam to be constantly progressed, and
the second exposure beam diameter changing lens has the convex cylindrical lens structure.

10. The light exposer of claim 9, wherein
the distance between the second exposure beam diameter changing lens and the first prism is 34.2 mm.

11. The light exposer of claim 3, wherein
the exposure beam generator further comprises
a fourth exposure beam diameter changing lens positioned after the third exposure beam diameter changing lens and maintaining the diameter of the exposure beam to be constantly progressed, and
the fourth exposure beam diameter changing lens has the concave cylindrical lens structure.

12. The light exposer of claim 11, wherein
the distance between the fourth exposure beam diameter changing lens and the second prism is 120.4 mm.

13. The light exposer of claim 1, wherein
the exposure beam generator further comprises
an exposure beam diffusion unit expanding the exposure beam generated in the oscillator,
an amplifier comprising an amp pumping chamber,
a high-frequency generator comprising a second harmonized generator and a third harmonized generator, and
first and second bend mirrors bending a light path of the exposure beam.

14. A method for controlling a light exposer comprising a prism, an exposure beam generator comprising first and second exposure beam diameter changing lens, and a vacuum chamber passing the exposure beam generated from the exposure beam generator and comprising a first fly eye lens having a plurality of convex lens like fly eyes, comprising:
   generating an exposure beam from the exposure beam generator;
   measuring a shape of the exposure beam in the vacuum chamber; and
   adjusting the first or second exposure beam diameter changing lens when the measured shape of the exposure beam is deviated from a predetermined range.

15. The method of claim 14, wherein
the adjusting of the first or second exposure beam diameter changing lens comprises changing a distance of the first or second exposure beam diameter changing lens to the prism.

16. The method of claim 15, wherein
the diameter of the exposure beam according to a lens interval of the first exposure beam diameter changing lens and the second exposure beam diameter changing lens satisfies an equation below:

$$y = -0.4386x + 8.9887$$

wherein x is a lens interval and y is a diameter of the exposure beam.

17. The method of claim 16, wherein
the diameter of the exposure beam has a minimum value when an illumination distribution of the exposure beam is most stable, and a maximum value that is less than the width of the first fly eye lens by 1 mm.

18. The method of claim 17, wherein
the diameter of the exposure beam is more than 8 mm to less than 11 mm.

* * * * *